(12) United States Patent
Regier

(10) Patent No.: US 6,243,034 B1
(45) Date of Patent: Jun. 5, 2001

(54) INTEGRATING ANALOG TO DIGITAL CONVERTER WITH IMPROVED RESOLUTION

(75) Inventor: Christopher G. Regier, Cedar Park, TX (US)

(73) Assignee: National Instruments Corporation, Austin, TX (US)

( * ) Notice: Subject to any disclaimer, the term of this patent is extended or adjusted under 35 U.S.C. 154(b) by 0 days.

(21) Appl. No.: 09/290,218

(22) Filed: Apr. 13, 1999

Related U.S. Application Data

(60) Provisional application No. 60/106,109, filed on Oct. 29, 1998.

(51) Int. Cl.[7] .................................................. H03M 1/50
(52) U.S. Cl. ................................................. 341/166; 341/155
(58) Field of Search .................................. 341/155, 156, 341/166, 161

(56) References Cited

U.S. PATENT DOCUMENTS

| | | | |
|---|---|---|---|
| 4,320,390 | 3/1982 | Scott | 340/347 |
| 4,357,600 | 11/1982 | Ressmeyer et al. | 340/347 |
| 4,379,260 * | 4/1983 | Labus | 324/99 |
| 4,395,701 * | 7/1983 | Evans | 340/347 |
| 4,656,459 * | 4/1987 | Thurber, Jr. | 340/347 |
| 4,939,520 * | 7/1990 | Biglow | 341/167 |
| 5,099,239 * | 3/1992 | Bruce et al. | 341/155 |
| 5,101,206 | 3/1992 | Riedel | 341/156 |
| 5,117,227 | 5/1992 | Goeke | 341/166 |
| 5,194,868 * | 3/1993 | Bahng et al. | 341/167 |
| 5,523,756 * | 6/1996 | Mariuz et al. | 341/118 |
| 5,844,514 * | 12/1998 | Ring et al. | 341/143 |
| 5,886,660 | 3/1999 | Loewenstein | 341/166 |
| 5,894,282 * | 4/1999 | Betts et al. | 341/157 |

OTHER PUBLICATIONS

T. C. Leslie and B. Singh "An Improved Sigma–Delta Modulator Architecture," IEEE Proc. ISCAS '89, vol. 1, pp. 372–375, May 1990.

\* cited by examiner

*Primary Examiner*—Peguy JeanPierre
(74) *Attorney, Agent, or Firm*—Conley, Rose & Tayon PC; Jeffrey C. Hood

(57) ABSTRACT

An analog to digital (A/D) converter system and method which provides improved resolution and reduced noise for integrating-type ADCs, including dual slope, multi slope, and sigma-delta type A/D converters. After the ramp-up interval of either a dual slope or multi slope integrating A/D converter, the ramp-down interval occurs, wherein a reference signal is then applied to the integrator to return the integrator to its original value. The clock cycles are counted while the reference voltage is applied to determine a primary slope count value. During the ramp-down interval, while the reference voltage is applied, two or more integrator voltages are measured. In one embodiment, a first integrator voltage is measured before the original value and a second integrator voltage is measured after the original value, e.g., before and after the zero crossing. The method then determines a fractional slope count based on the measured two or more integrator voltages, i.e., the fractional slope count occurring before the return of the integrator to its original value. The fractional slope count is determined by extrapolating or interpolating the return of the integrator to its original value using the measured two or more integrator voltages. The total slope count is then calculated using the primary and fractional slope counts, and the output digital value is determined using the total slope count value.

38 Claims, 15 Drawing Sheets

FIG. 15 MULTI-SLOPE

INTEGRATING ANALOG TO DIGITAL CONVERTER WITH IMPROVED RESOLUTION

PRIORITY DATA

This application claims benefit of priority of U.S. provisional application Ser. No. 60/106,109 titled "Integrating Analog to Digital Converter with Improved Resolution" and filed Oct. 29, 1998, whose inventor was listed as Christopher G. Regier.

FIELD OF THE INVENTION

The invention relates to the art of analog-to-digital (A/D) converters, and more particularly, to integrating A/D converters.

DESCRIPTION OF THE RELATED ART

Analog-to-digital converters (ADCs) are circuits used to convert signals from the analog domain, where the signals are represented by continuous quantities such as voltage and current, to the digital domain. These circuits can be implemented in a large number of ways. Established A/D conversion techniques include flash, sigma-delta, sub-ranging, successive approximation, and integrating.

Integrating ADCs function by integrating or averaging the input signal over a fixed time. This operates to reduce noise and eliminate interfering signals. Integrating ADCs are thus often used for digitizing signals that are not changing rapidly with time, such as DC signals, or in applications where the desired result is a time average of the input signal. Integrating ADCs are used in applications where a very high resolution is required at a comparatively low sample rate.

A traditional integrating ADC is illustrated in FIG. 1. As shown, the integrating ADC in FIG. 1 comprises an integrator, a comparator, and control logic. The integrating ADC converts an unknown analog input voltage Vin into a digital signal, known in the art as an "integrator count."

As shown in FIG. 1, the analog input voltage Vin is provided through a switch SW1 to an input of the integrator 402. The integrator 402 comprises an operational amplifier (op-amp) 404 and a parallel capacitor C1. The integrator 402 receives the unknown analog input voltage Vin and provides an integrator output voltage Vint to a comparator 408. The comparator 408 compares Vint with a reference voltage, e.g., ground, and produces a comparator output voltage Vc. The comparator output Vc is a digital signal which indicates whether Vint was greater or lesser than the reference voltage.

The comparator 408 provides the output Vc to the control logic 410, which in turn controls the switch SW1. The switch SW1 is controlled to selectively couple either the input voltage Vin or a reference voltage Vref to an input of the integrator at any given time. When the input voltage Vin is coupled to the integrator 402, the integrator 402 charges. When the reference voltage Vref is coupled to the integrator 402, the reference voltage Vref operates to discharge the integrator 402. The reference voltage Vref may either be positive or negative and may be either a voltage or current source. The control logic 410 outputs the slope count or integrator count.

FIG. 2 illustrates a technique known as dual slope integration which has been employed by traditional integrating ADCs, as shown in FIG. 1, in order to generate a digital output. The dual slope approach is a commonly used integrating A/D architecture. The dual slope method uses two half cycles, referred to as the up slope, run-up interval, or ramp-up interval (RU) and the down slope, run-down interval, or ramp-down interval (RD).

In the dual slope integrating ADC, the unknown input analog voltage, Vin, is applied to the integrator 402 for a ramp-up (RU) interval of duration T as depicted in FIG. 2. The control logic 410 then adjusts the switch SW1 to couple the reference voltage Vref to the input of the integrator. As a result, the analog input voltage Vin is disconnected and simultaneously the reference discharging voltage Vref is applied to the integrator 402 during a ramp-down (RD) interval for a duration t. When the capacitor C1 becomes completely discharged, the RD interval ends and hence the integrator output, Vint, is zero. Thus the input signal is integrated during the up slope for a fixed time, and then a reference of opposite sign is integrated during the down slope to return the integrator output to zero.

The duration of the ramp-down time t in the RD interval is typically measured by counting (usually synchronously with a clock) during the RD interval. The value of the unknown analog input voltage Vin is then computed as follows:

$$Vin = Vm/T$$

Thus the input voltage Vin can be calculated from the integrated voltage Vm divided by the ramp-up time period T, hence essentially computing the average value of Vin for the ramp-up time period T. The integrated voltage Vm can be computed as:

$$Vm = Vref \times t$$

Thus the Voltage Vin can be calculated as:

$$Vin = t \times (Vref/T)$$

For a given count or ramp-down time period t, the sensitivity of the ADC increases with a decrease in the rate at which the capacitor C1 discharges. Therefore, sensitivity may be increased by decreasing the magnitude of Vref. However, a decrease in the magnitude of Vref results in a slower response of the circuit.

The sensitivity of the A/D can also be increased by increasing the maximum voltage, Vm, of the integrator output voltage, Vint, during the RU interval. Vm can be increased by lowering the value of the input resistance prior to the integrator 402. However, the integrator output voltage, Vint, must be within the bounds of the op-amp 404 power supply voltage limits.

In the dual slope method, the RU or up-slope integration time T can be set to an integer number of periods of the clock. However, the time period t required to return the integrator output to zero will generally not be an exact integer number of clock periods, since Vm can assume any value. Thus there will be a possible error of plus or minus (+/−) 1 count in how well the number of counts in the time period t describes Vin.

One way to improve the resolution of a dual slope integrating A/D converter is to increase the fixed number of clock periods in the RU or up slope, which has the effect of linearly increasing the time required for both the up slope and the down slope. Another way to improve the resolution of a dual slope integrating A/D converter is to lower the reference voltage Vref, so that the RU or up slope time is constant but the down slope time is increased linearly. In either case, the increased resolution requires a linear increase in the number of clock periods in the conversion.

Thus the increased resolution comes at the direct expense of conversion time.

Another technique to increase the speed of the dual-slope integrating ADC is to use a pair of resistors, one for ramp-up and the other for ramp-down. The ramp-down resistor has a much greater resistance value than the ramp-up resistor. Thus the ramp-up time is shortened, while the ramp-down time and hence the resolution remains the same. The cost of this technique is an additional resistor and sensitivity of the ADC to the ratio of the two resistors.

A better method for improving the resolution of an integrating A/D converter with a lesser impact on conversion time is to use a multi-slope architecture. The "multisloping" technique maintains high sensitivity and, at the same time, increases the response time of the integrating ADC. U.S. Pat. No. 4,356,600 to Ressmeyer, which is incorporated herein by reference, describes the use of multisloping for producing a digital representative of the unknown analog input voltage, Vin.

A block diagram of a first type of multislope ADC is shown in FIG. 3. The multislope ADC shown in FIG. 3 utilizes multislope ramp-down to reduce the time required to perform ramp-down. This multislope ADC differs from the dual slope approach in that there are separate up and down integration resistors, and furthermore, there are multiple values for the down slope integration resistors. Using different resistors for the up and down slope portions introduces the possibility of errors due to resistor mismatch. The dual slope is immune to this problem since only one resistor is used. However, high-quality resistor networks with good temperature tracking and linearity can overcome this disadvantage.

The advantage of the multislope architecture is a decrease in conversion time or an increase in resolution. As shown in FIG. 4, the time required for the down slope at a given resolution can be reduced by operating multiple "down" slopes, each at successively lower currents. In the example of FIG. 4, the first down current is opposite in sign to the input, and sufficiently large that the integrator will cross zero in less than 10 counts. When the integrator output crosses zero, the current is turned off at the next clock transition. The amount by which the integrator overshoots zero depends on the exact input voltage. To digitize this "residue" accurately, a second, 10 times lower, opposite sign down slope current is selected. Zero is crossed again but from the opposite direction, and with 10 times lower slope. The overshoot is once again proportional to the exact input but will now be 10 times lower in amplitude owing to the lower slope. The counts accumulated in this down slope phase are accorded 10 times lower significance.

An indefinite number of these down slopes can be successively applied, each adding (in this example) a decade to the resolution but adding very little percentage increase to the overall conversion time. In summary the multislope ramp-down approach offers dramatic improvements in resolution-speed tradeoff compared with the simple dual slope architecture, at the expense of more complexity and the need for well-matched resistors.

Despite improvements in speed, the multislope ramp-down technique has several disadvantages. First, the multislope ramp-down technique is more expensive to implement, since the ADC now requires a resistor network with precision resistors and precise ratios. Also, the multislope ramp-down technique requires a more complex control circuit and is subject to the inaccuracies of the resistors.

FIG. 5 illustrates a second type of multislope ADC which utilizes a multislope ramp-up technique to increase the resolution of the ADC. The multislope ramp-up technique involves periodically applying a positive reference voltage, +Vref, or a negative reference voltage, −Vref, to the integrator input, Vint during the ramp-up period. The input voltage and the offsetting reference current are applied during the multislope ramp-up period so that the charge from the unknown analog input, Vin, plus the charge from the reference voltage, Vref, is never large enough to saturate the integrator 402. This allows for a much longer ramp-up period.

The multislope ramp-up technique accounts for the total amount of reference charge transferred to the integrator 402, known as slope count, during the RU and RD intervals. The total amount of reference charge transferred to the integrator 402, the slope count, is the number of time intervals during which the integrator 402 is ramping positive minus the number of time intervals during which the integrator 402 is ramping negative. Thus the multislope ramp-up technique allows for a much greater ramp-up voltage, i.e., allows the integrating ADC to having a larger effective voltage swing than allowed by the physical limitations of the integrator circuit. Thus the digital output of an integrating ADC using the multislope ramp-up technique can be measured with higher accuracy and resolution than the dual slope configuration.

FIG. 6 illustrates three integrator output voltage waveforms for different input voltages applied to an ADC using the multislope ramp-up technique. As shown, the integrator output voltage waveforms are dependent on the sign and magnitude of the input voltage. The slope count is the number of time intervals of duration T during which the integrator is ramping positive minus the number of time intervals of duration T during which the integrator is ramping negative.

The top waveform (waveform 1) of FIG. 6 illustrates the response for a positive input voltage Vin whereby the integrator ramps negative at a faster rate then the integrator ramps positive, thereby producing a positive overall slope count. The middle waveform (waveform 2) of FIG. 6 illustrates the response for a zero input voltage Vin whereby the integrator ramps negative and ramps positive at the same rate, thereby producing a zero slope count. The bottom waveform (waveform 3) of FIG. 6 illustrates the response for a negative input voltage Vin whereby the integrator ramps positive at a faster rate then the integrator ramps negative, thereby producing a negative overall slope count.

As shown in FIG. 6, the multislope ramp-up technique results in a residual integrator voltage which generally must be zeroed with a ramp-down technique, such as a multislope ramp-down technique. As shown in the waveforms of FIG. 6, the integrator output voltage, Vint, will not necessarily be at zero volts at the end of the RU interval and will ordinarily vary from zero depending on the exact value of the input voltage, Vin. The remaining voltage is a residual voltage. Thus, as with the dual slope technique, the multislope ramp-up technique results in a residual integrator voltage which generally must be zeroed or otherwise accounted for with a ramp-down technique, such as a multislope ramp-down technique.

Although the multisloping technique improves resolution, the resulting time period required for a reading may still be too great for a high resolution output. This is especially true when the multislope ramp-up technique is used in combination with a ramp-down technique, such as the multislope ramp-down technique. In general, the multislope ramp-down technique adds a significant amount of time to the A/D conversion of a multislope A/D converter.

A class of ADCs called sigma-delta A/D converters operate wherein an input signal to be converted is applied to an integrator, and an approximation of the input signal is applied in opposite polarity. In this case as well, a signal remains on the integrator output which represents the error of the approximation. Thus in dual slope and multislope integrating ADCs, as well as sigma-delta ADCs, a signal remains on the integrator that represents the error of the approximation.

Therefore, improved methods are desired to provide a more responsive ramp-down technique.

U.S. Pat. No. 5,101,206 to Riedel titled "Integrating Analog to Digital Converter" issued on Mar. 31, 1992 discloses a technique which purports to reduce the RD interval of the multi-slope technique. The Riedel system includes the addition of a conventional ADC, referred to as a residue ADC, to the integrator. FIG. 7 illustrates a generalized ADC including a residue ADC as taught by Riedel. The additional residue ADC measures the residual integrator output voltage Vint-res which remains after the RU interval. The residual integrator output voltage Vint-res is then converted into a fractional part of a slope count using a complex calibration equation, and the fractional slope count is added to the slope counts derived during the RU interval. The total slope count is equal to the sum of (1) the difference between the positive and negative slope counts derived during the RU interval and (2) the fractional number of slope counts derived from the fractional integrator voltage. The least significant bits of the digital output of the ADC are thus computed by measuring the residual integrator voltage at the end of the RU interval.

The integrating A/D converter taught in Riedel is not required to proceed through the entire ramp-down interval and thus provides a higher speed operation. However, although the A/D converter taught in Riedel is not required to proceed through the entire ramp-down interval, the A/D converter is required to use a ramp-down interval in order to measure the residual integrator voltage. Thus the Riedel method is not optimal in terms of speed.

U.S. Pat. No. 5,117,227 to Goeke titled "Continuously Integrating High-Resolution Analog-to-Digital Converter" discloses an improved multislope integrating A/D converter. Goeke improves the ADC taught by Riedel by not requiring the integrator to be zeroed or initialized at the beginning of each count by switch SW4, and also not requiring that the input voltage, Vin, be periodically switched off. In other words, the integrating ADC in Goeke enables complete avoidance of the RD interval and thereby increases its speed.

Goeke includes a residue ADC that measures the integrated output at the beginning and end of a time interval corresponding to a reading. The integrated output sampled at the beginning of the time interval is the first residue voltage, whereas the integrated output sampled at the end of the time interval is the second residue voltage. The control/output logic then converts the first and second residue voltages into a residue count. The difference between the first and second residue counts is required to be mathematically scaled by a calibration constant K in order to convert the difference into a fraction of a single slope count so that it can be added to the slope count from the integrator. The control/output logic then mathematically combines the residue count and the integrator count within the time interval of the reading to derive the output digital signal.

Thus, in Goeke, the residual integrator voltage or error is compensated by measuring the change in integrator voltage from conversion to conversion (or from reset phase to conversion in the dual-slope ADC case) with a higher-speed ADC, such as a successive-approximation type. The change in integrator voltage represents error accumulated during a conversion and can be subtracted from the measurement in the digital domain using appropriate scaling factors.

The major drawback of the Goeke method is that the scaling factor or calibration value depends on the relative gains of the integrator and the residue ADC. If this scaling factor is incorrect, for example if the passage of time or a change of temperature has caused some component values to drift, then the overall ADC becomes noisy at best, and non-monotonic at worst. This limits this technique to adding about 6 bits of resolution to any sort of integrating ADC.

Therefore, an improved A/D converter and method is desired which improves the resolution and lowers the noise of integrating-type ADCs, including sigma-delta type A/D converters. An improved A/D converter is also desired which does not require complex calibration equations or calibration values.

SUMMARY OF THE INVENTION

The present invention comprises an analog to digital (A/D) converter system and method. The present invention provides improved resolution and reduced noise for integrating-type ADCs, including dual slope, multi slope, and sigma-delta type A/D converters.

The system comprises an integrator, a comparator, a residue ADC, and a control logic unit or processor. The integrator is configured to integrate an input analog signal combined with input reference signals. The comparator is connected to the integrator and is configured to detect polarity changes. The residue ADC is connected to the output of the integrator. The control logic unit or processor is connected to the outputs of the residue ADC and the comparator and operates to determine a fractional slope count during the ramp-down period. The processor extrapolates or interpolates successive integrator measurements to detect zero crossings, and uses this zero crossing information to determine the fractional slope count. The fractional slope count is then combined with the primary slope count to produce a digital value corresponding to the input voltage.

For a dual slope integrating A/D converter, the method comprises integrating the input analog signal for a first period of time, referred to as the ramp-up interval. For the multi slope integrating A/D converter, the input analog signal, selectively combined with a positive or negative reference voltage, is integrated over a plurality of time intervals (the ramp-up interval) to produce an integrated output signal. The positive reference voltage is applied to the integrator for a number of time intervals corresponding to a positive slope count and the negative reference voltage is applied to the integrator for a remaining number of time intervals corresponding to a negative slope count.

After the ramp-up interval, a reference signal is then applied to the integrator to return the integrator to its original value, referred to as the ramp-down interval. In the multi slope case, the primary slope count value comprises the difference in positive and negative slope counts, coupled with any integer counts during the ramp-down interval. During the ramp-down interval, while the reference voltage is applied, two or more integrator voltages are measured. In one embodiment, a first integrator voltage is measured before the original value and a second integrator voltage is measured after the original value, e.g., before and after the zero crossing.

The method then determines a fractional slope count occurring at the end of the ramp-down interval based on the measured two or more integrator voltages, i.e., the fractional slope count occurring before the return of the integrator to its original value, referred to as y0. The fractional slope count is determined by extrapolating or interpolating the return of the integrator to its original value (y0) using the measured two or more integrator voltages. For example, where a first measured integrator voltage before the original value has value y1 and a second measured integrator voltage after the original value has value y2, the fractional slope count value is computed as (y1−y0)/(y1−y2); where y0 is the original value and is presumably zero. The fractional slope count may also be determined using line fitting techniques or other extrapolation techniques.

The method may also determine a fractional slope count occurring prior to the integration interval, also based on two or more measured integrator voltages, i.e., the fractional slope count occurring immediately prior to the ramp-up interval. The fractional slope count for the "prior interval" is determined in a similar manner as above. For example, where a first measured integrator voltage before the original value has value y1 and a second measured integrator voltage after the original value has value y2, the fractional slope count value for the "prior interval" is computed as (y2−y0)/(y2−y1); where y0 is the original value and is presumably zero.

The total slope count is then calculated using the primary slope count value and the fractional slope count value. In the dual slope type A/D converter, the total slope count is calculated by summing the primary slope count value and the fractional slope count value. In the multi slope type A/D converter, the total slope count is calculated as follows. Assuming "A" positive slope counts and "B" negative slope counts during ramp-up, and "a" positive (fractional) slope counts and "b" negative (fractional) slope counts during ramp-down, the result of the A/D conversion, referred to as a "slope count" or "slope ratio", should be ((A+a)−(B+b))/((A+a)+(B+b)). The positive fractional slope count "a" is the sum of the positive slope counts, if any, of the prior interval and/or the subsequent interval. In a similar manner, the negative fractional slope count "b" is the sum of the negative slope counts, if any, of the prior interval and/or the subsequent interval.

The A/D converter then outputs the total slope count value or slope ratio value as the digital value corresponding to the input analog voltage.

For a sigma delta type integrating A/D converter, the method comprises first integrating the input analog signal for a current interval, and then applying a reference signal to the integrator to return the integrator to its original value. Two or more integrator voltages are measured while the reference signal is applied.

Here it is assumed that a first fractional slope count was determined in a prior interval immediately before the current interval. The first fractional slope count indicates a deviation of the integrator from a reference value at the beginning of the current interval. The method then determines a second fractional slope count during a subsequent interval immediately after the current interval. The second fractional slope count indicates a deviation of the integrator from a reference value at the end of the current interval. The method then determines a fractional slope count for the current interval based on the first and second fractional slope counts.

The above steps are repeated one or more times, as desired. After the above steps have been repeated, the method filters the fractional slope counts for a plurality of intervals to produce the output digital signal.

BRIEF DESCRIPTION OF THE DRAWINGS

A better understanding of the present invention can be obtained when the following detailed description of the preferred embodiment is considered in conjunction with the following drawings, in which.

Figure 1:
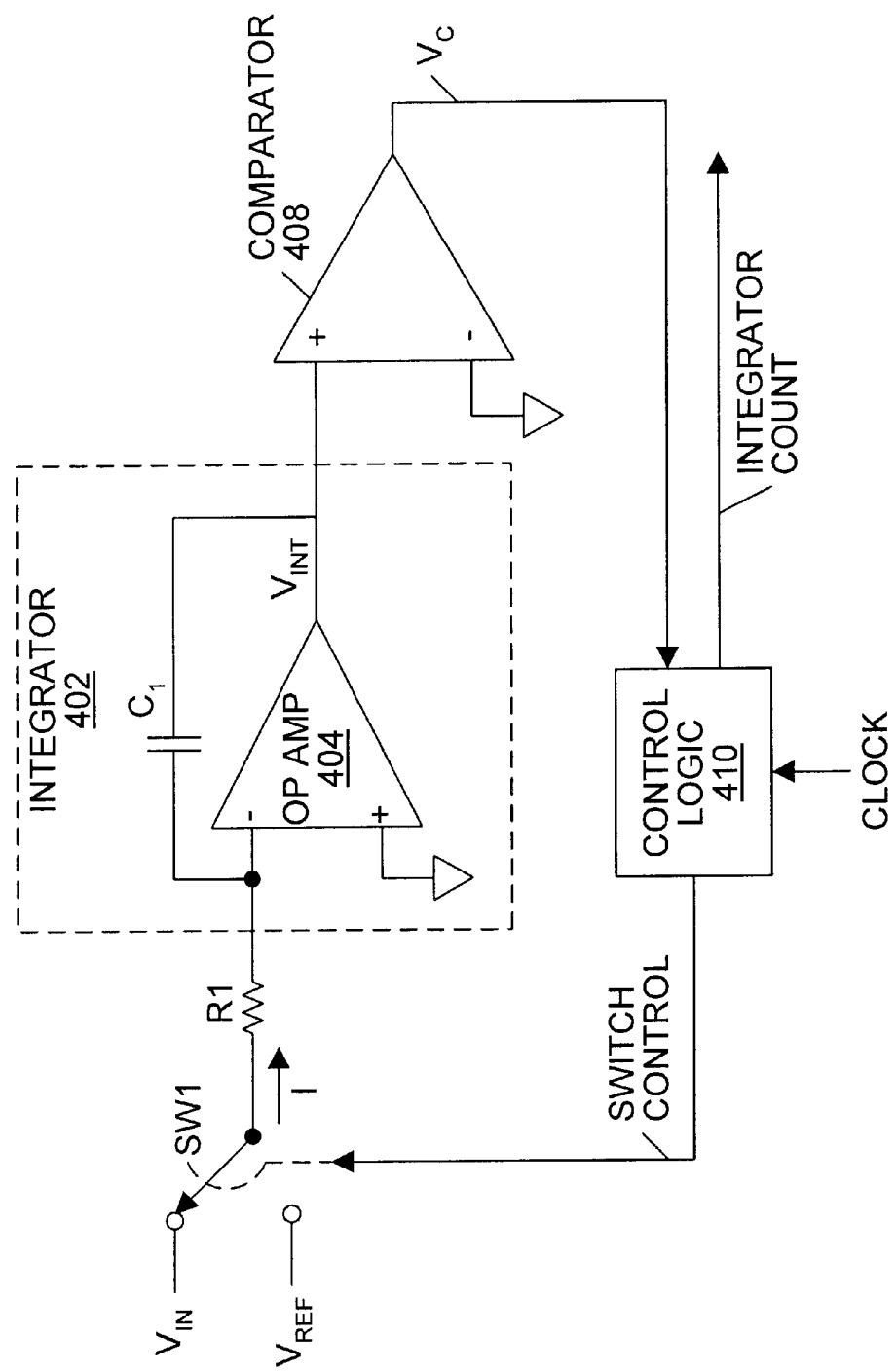
FIG. 1 illustrates a prior art dual slope analog to digital converter (ADC)
Figure 2:
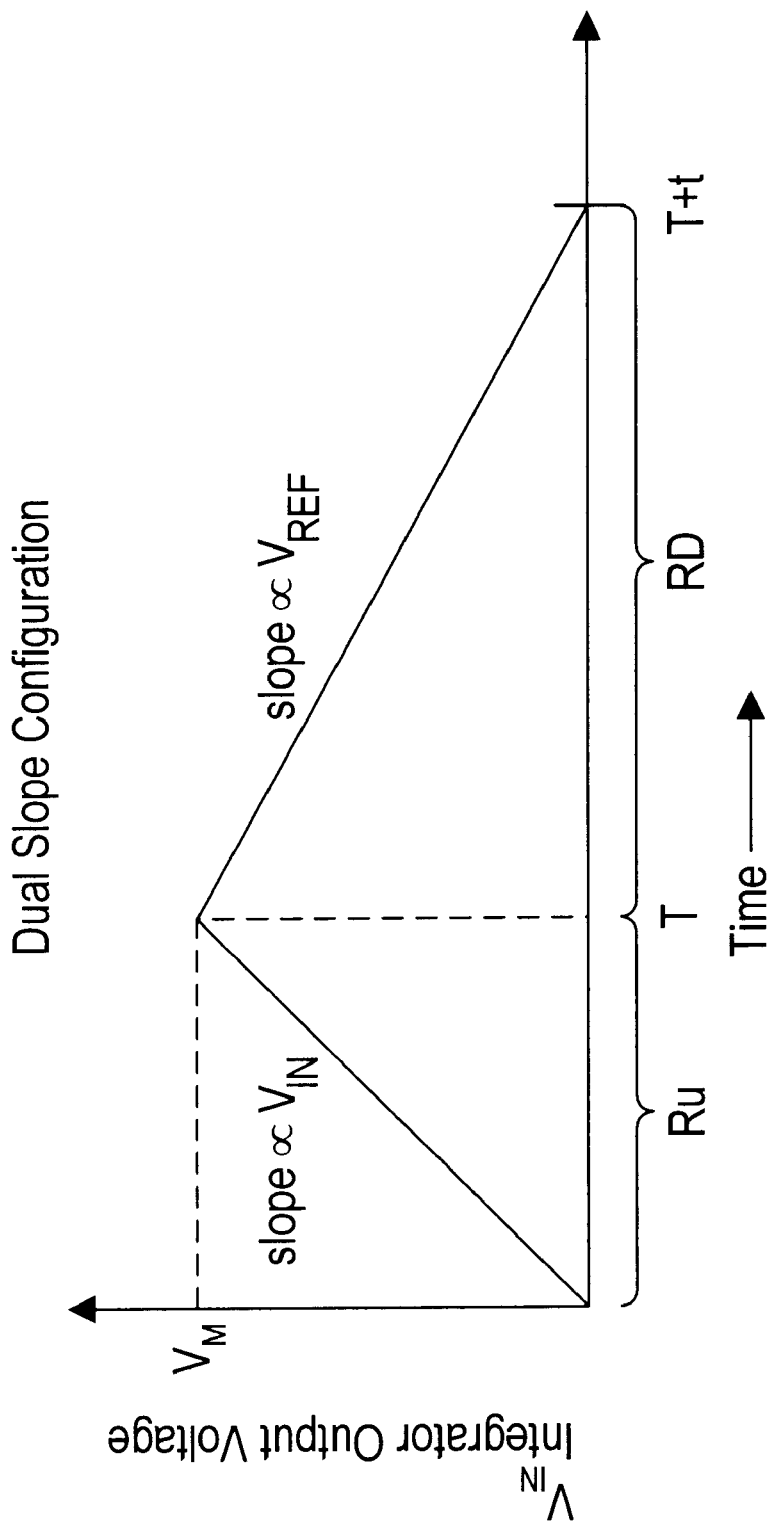
FIG. 2 illustrates a waveform of a dual slope ADC in prior art.
Figure 3:
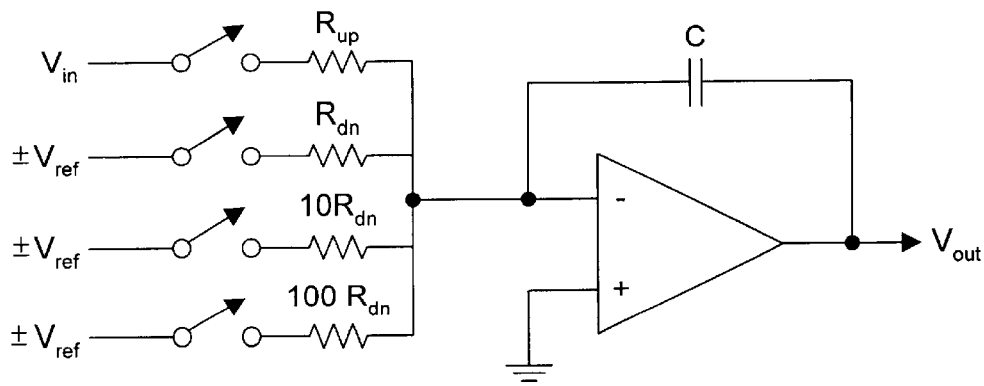
FIG. 3 illustrates a prior art multi slope ADC employing multi-slope ramp-down.
Figure 4:
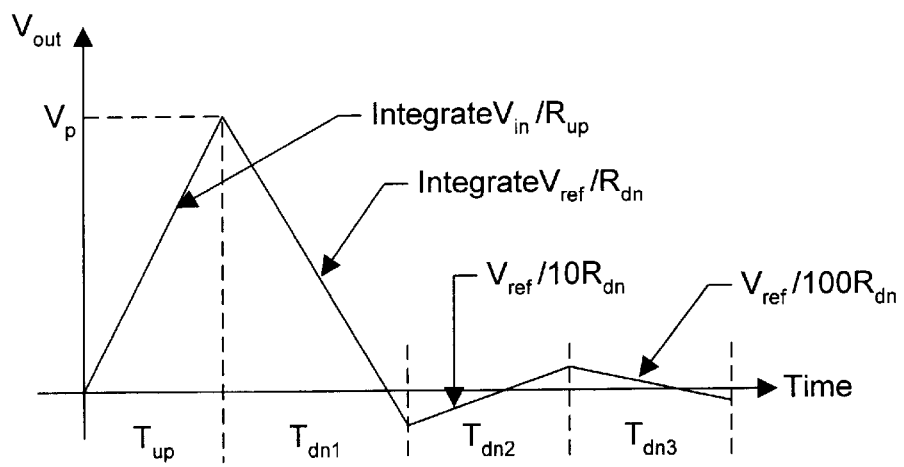
FIG. 4 illustrates a waveform of a multi-slope ramp-down performed by the prior art ADC of FIG. 3.
Figure 5:
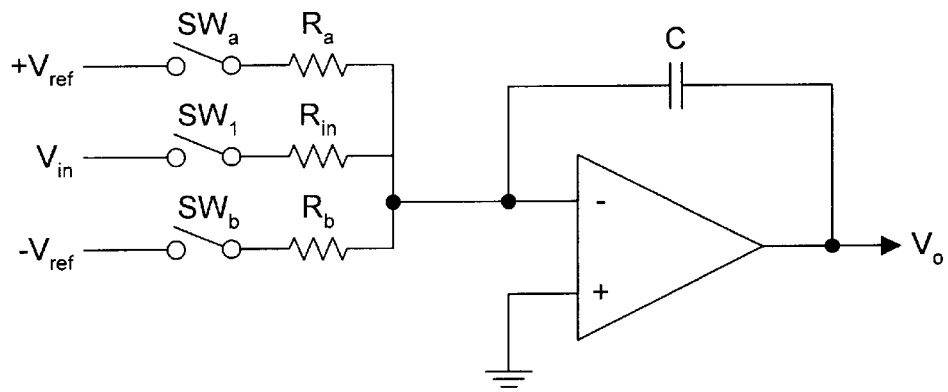
FIG. 5 illustrates a prior art multi slope ADC employing multi-slope ramp-up.
Figure 6:
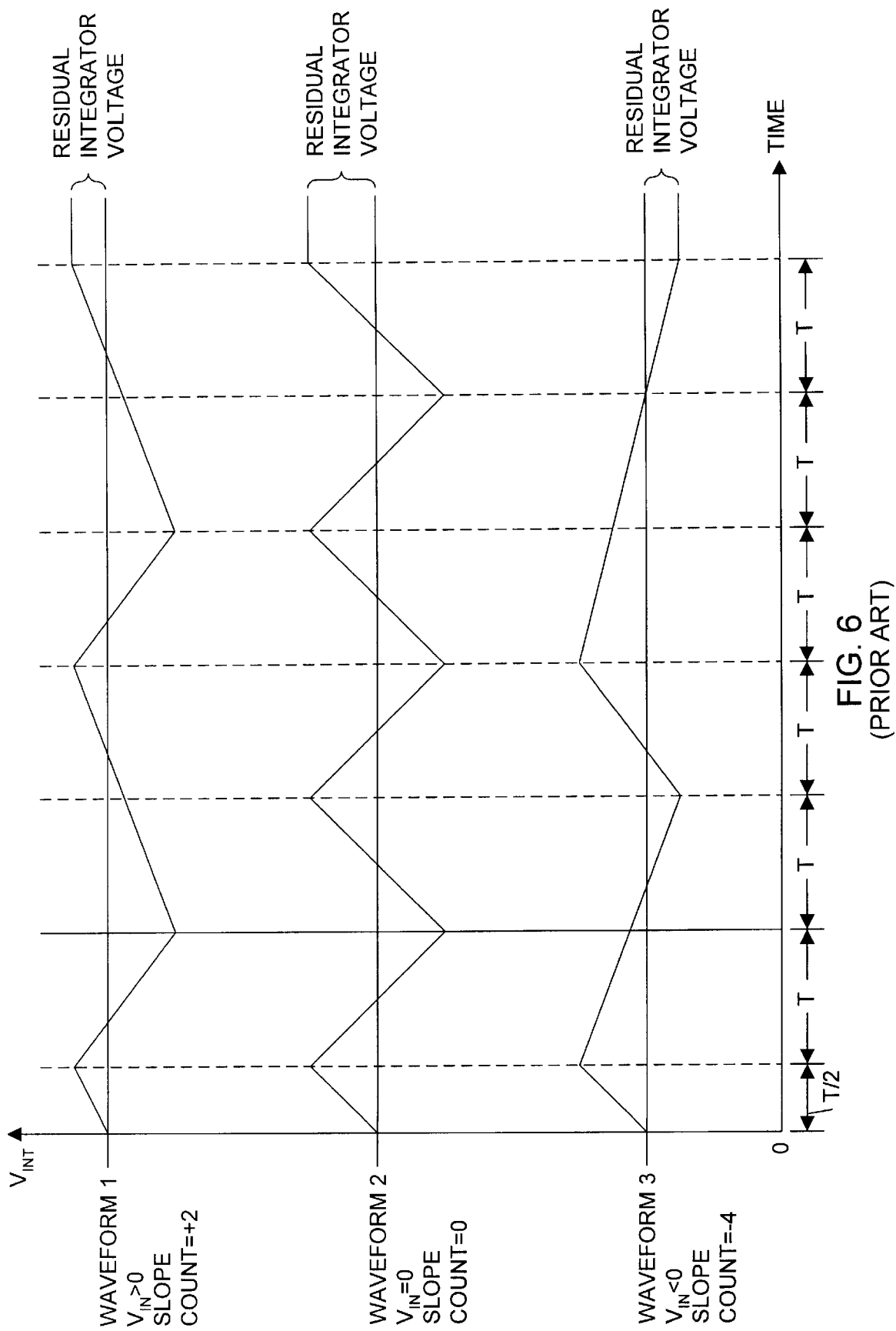
FIG. 6 illustrates a waveform of a multi-slope ramp-up performed by the prior art ADC of FIG. 5.
Figure 7:
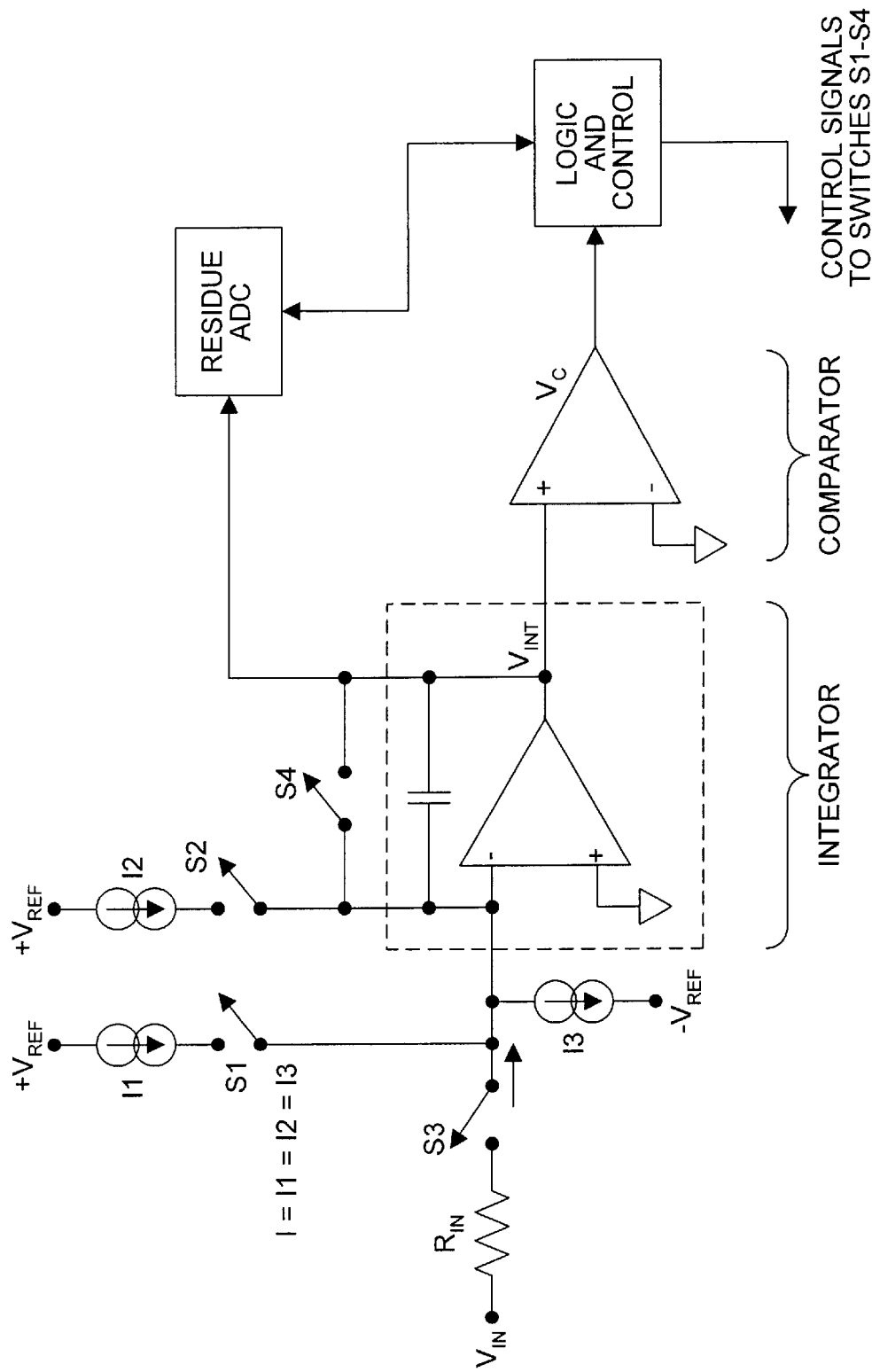
FIG. 7 is a block diagram of a prior art integrating ADC in which the residual integrator voltage at the end of the ramp-up interval is measured using a conventional ADC (residue ADC) for the purpose of substantially eliminating the need for the ramp-down interval.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENT

Figure 8:
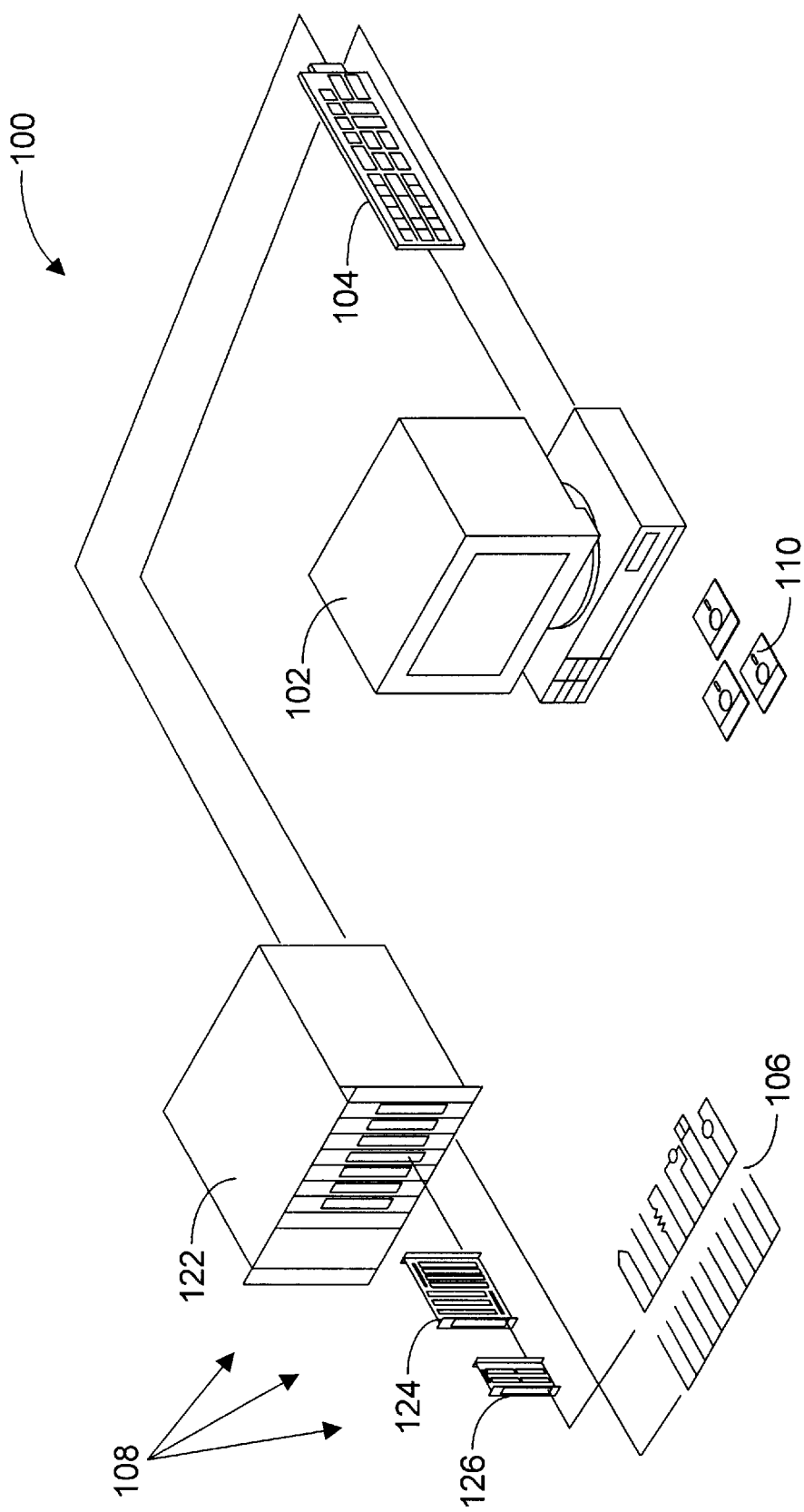
FIG. 8 illustrates an instrumentation system which includes the analog to digital converter employing the present invention.

FIG. 8—Instrumentation System

FIG. 8 illustrates a computer-based instrumentation system 100 according to one embodiment of the present invention. The analog to digital converter system of the present invention is preferably comprised in the computer-based instrumentation system 100. However, the analog to digital converter system of the present invention may also be comprised in a standard handheld or benchtop instrument, such as a standard multimeter, or in any of various other systems which use analog to digital converters. Examples of systems where the analog to digital converter system may be used include instrumentation systems, industrial automation systems, audio systems, telephony systems, video systems, and other systems where analog to digital conversion is performed. Thus FIG. 1 is an example of one embodiment, and the present invention may be used in any of various systems.

The instrumentation system 100 comprises a computer 102 having an operating system and other software, an instrumentation device or board 104 coupled to the computer 102, and transducers 106 or other detecting means which provide field electrical signals to/from the instrumentation device 104 through signal conditioning logic 108.

The computer 102 includes various standard components, including at least one central processing unit (CPU), memory, a non-volatile memory, one or more buses, and a power supply. The computer also stores software programs, represented by medium 110. In one embodiment, the computer 102 comprises input/output (I/O) slots into which the instrumentation device 104 is coupled.

In the embodiment of FIG. 8, the instrumentation device 104 is a board or card adapted for insertion into an expansion slot of the computer system 102. The board 104 is shown external to the computer system 102 in FIG. 8 for illustrative purposes. In another embodiment, the instrumentation device 104 is external to the computer 102. For example, the device 104 may be coupled to the computer 102 by a VXI (VME Extensions for Instrumentation) chassis and bus, a GPIB (General Purpose Interface Bus), a serial bus or port, e.g., USB or IEEE 1394, a parallel port, or other type of bus or cabling. The instrumentation device 104 may be any of various types, such as a data acquisition (DAQ) device or card, a multimeter card, a voltmeter card, etc. In the embodiment of FIG. 8, the analog to digital converter system of the present invention is comprised in the instrumentation device 104.

The transducers 106 are optionally conditioned by the signal conditioning circuitry 108 for presentation to the device 104 as shown. In the embodiment of FIG. 8, the signal conditioning circuitry 108 comprises an SCXI (Signal Conditioning Extensions for Instrumentation) chassis 122, one or more SCXI modules 124, and one or more SCXI terminal blocks 126. SCXI is an open architecture, multichannel signal conditioning front-end system for instrumentation devices. SCXI comprises an external chassis housing signal conditioning modules for amplifying, multiplexing, and isolating field signals. The signal conditioning modules advantageously reduce the introduction of noise into the signals transmitted to the device 104.

The transducers 106 and other detecting means provide the field signals representing a process, physical phenomena, equipment being monitored or measured, etc. to/from the instrumentation device 104. Examples of the transducers 106 are strain gauges, thermocouples, thermistors, photoconductive cells, microphones, and piezoelectric transducers, among others.

Figure 9:
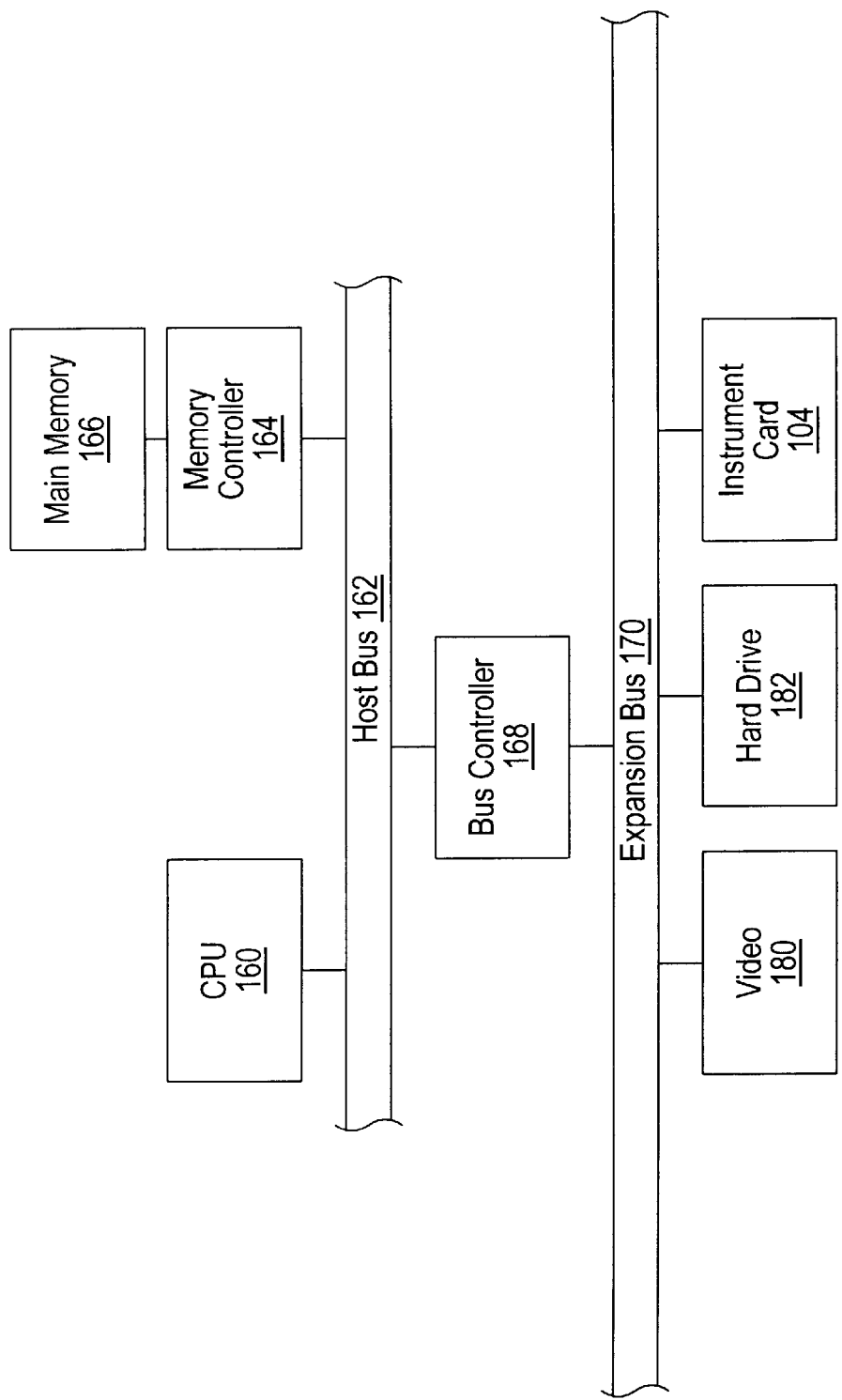
FIG. 9 is a block diagram illustrating the computer system in the instrumentation system of FIG. 8.

FIG. 9—Computer Block Diagram

FIG. 9 is a block diagram of the computer system 102 of FIG. 8. The elements of a computer not necessary to understand the operation of the present invention have been omitted for simplicity. Also, the computer 102 may have various architectures.

The computer 102 includes at least one central processing unit or CPU 160 which is coupled to a processor or host bus 162. The CPU 160 may be any of various types, including an x86 processor, a PowerPC processor, a CPU from the Motorola family of processors, a CPU from the SPARC family of RISC processors, as well as others. Main memory 166 is coupled to the host bus 162 by means of memory controller 164.

The main memory 166 may store application software for controlling the instrumentation system. The main memory 166 also stores operating system software as well as other software for operation of the computer system, as well known to those skilled in the art. The main memory 166 may also store software for performing a portion of the analog to digital conversion function according to the present invention.

The host bus 162 is coupled to an expansion or input/output bus 170 by means of a bus controller 168 or bus bridge logic. The expansion bus 170 is preferably the PCI (Peripheral Component Interconnect) expansion bus, although other bus types can be used. The expansion bus 170 includes slots for various devices such as the instrumentation board 104. The instrumentation board 104 may comprise a data acquisition board, a multimeter board, i.e., a board which implements multimeter functions, an oscilloscope board, or other type of instrumentation board. The computer 102 further comprises a video display subsystem 180 and hard drive 182, which may be coupled to the expansion bus 170.

As noted above, the instrumentation device 104 preferably includes the A/D converter system of the present invention. As also noted above, the A/D converter system and method of the present invention may be included in any of various systems. Thus FIGS. 8 and 9 illustrate one example of the use of the present invention.

Figure 10:
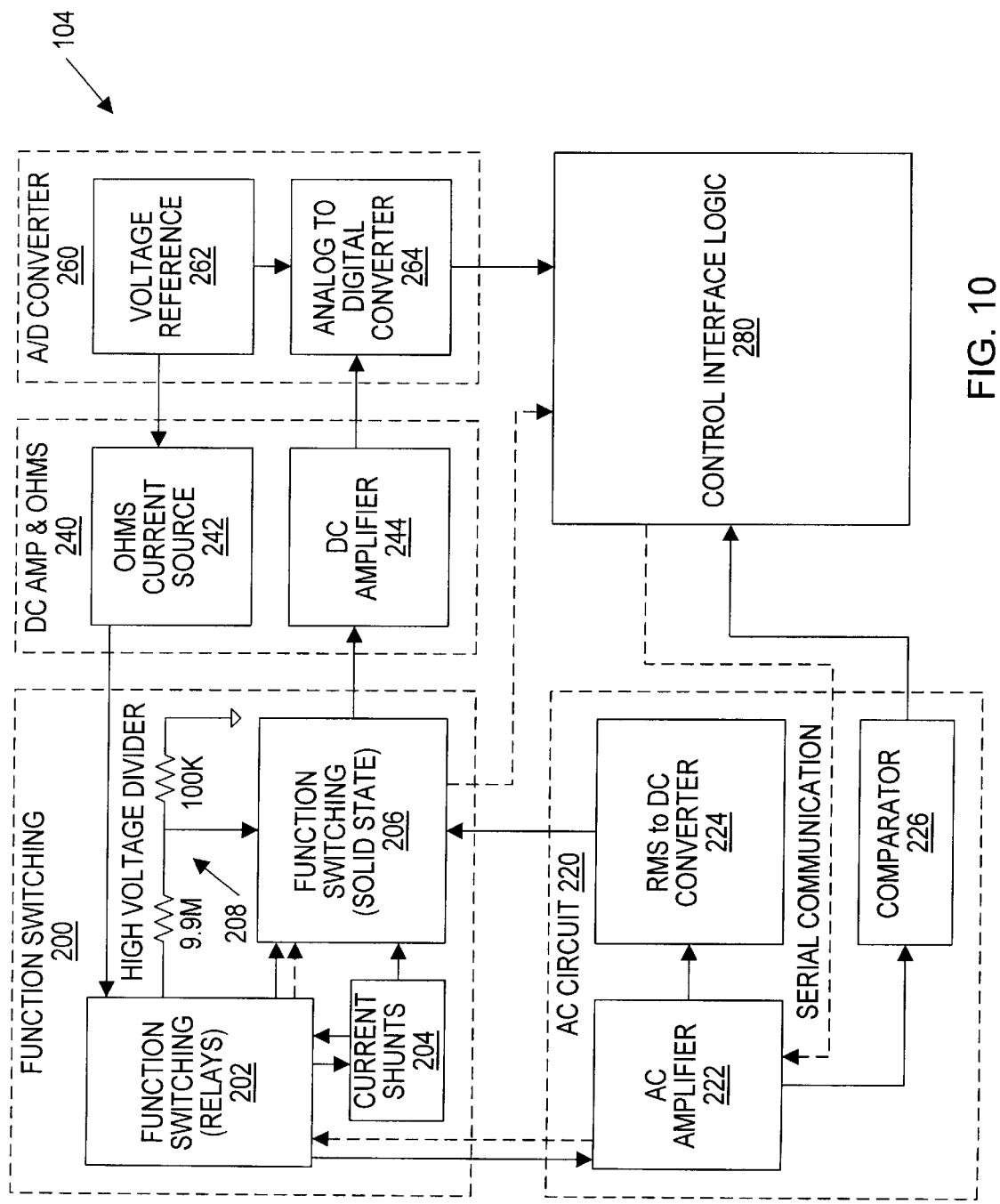
FIG. 10 is a block diagram of the instrumentation device of FIG. 9.

FIG. 10—Multimeter Block Diagram

FIG. 10 is a block diagram illustrating a portion of the instrumentation device 104 of FIG. 9 in one embodiment, wherein the instrumentation device 104 is a multimeter. It is noted that FIG. 10 is exemplary only, and the instrumentation device 104 may have various architectures or forms, as desired. Also, as noted above, the A/D converter system of the present invention may be included in any of various devices, as desired.

As shown, the instrumentation device 104 includes a function switching block 200, an AC circuit 220, a DC amplifier and ohm block 240, an A/D converter block 260 and control interface logic 280.

The function switching block 200 operates to switch between the various functions performed by the multimeter, such as voltage measurement, current measurement, DC/AC measurements, etc. The function switching logic 200 includes a function switching block 202 comprising a plurality of relays. The function switching block 202 couples to a high voltage divider 208. The function switching block 202 also couples to current shunts 204. The current shunts block 204 couples to function switching logic 206, which preferably comprises solid state logic.

The function switching block 202 also couples to the AC circuit 220. More specifically, the function switching block 202 couples to an AC amplifier 222. The AC amplifier provides an output to a comparator 226. The comparator 226 in turn provides an output to the control interface logic 280. The AC amplifier 222 is also preferably in serial communication with the control interface logic 280. The AC amplifier 222 also provides an output to an RMS to DC converter 224. The RMS to DC converter 224 operates to convert the root-mean-square (RMS) amplitude of an AC signal to a DC value. The RMS to DC converter 224 provides its output to the solid state function switching logic 206.

As shown, the instrumentation device 104 also includes the DC amplifier and ohm section 240. This block includes an ohms current source 242 and a DC amplifier 244.

The instrumentation device 104 also includes the A/D converter block 260. The A/D converter block 260 includes a voltage reference block 262 and an analog to digital (A/D) converter 264 according to the present invention. As discussed further below, the integrating A/D converter system 264 and method of the present invention operates to provide improved resolution and reduced noise.

The voltage reference block 262 provides an output to the ohms current source block 242 which in turn provides an output to the function switching relays 202. The solid state function switching block 206 receives an output from the high voltage divider 208 as well as from the relay function switching logic 202 and the current shunts 204 and provides an output to the DC amplifier 244 which in turn provides an output to the A/D converter 264. The solid state function switching block 206 and the A/D converter 264 are also coupled to the control interface logic 280.

The control interface logic 280 includes logic for controlling access to the computer display for displaying the acquired signals. For example, the control interface logic 280 includes expansion bus interface logic, e.g., PCI bus interface logic, for interfacing to the PCI expansion bus 170.

Figure 11:
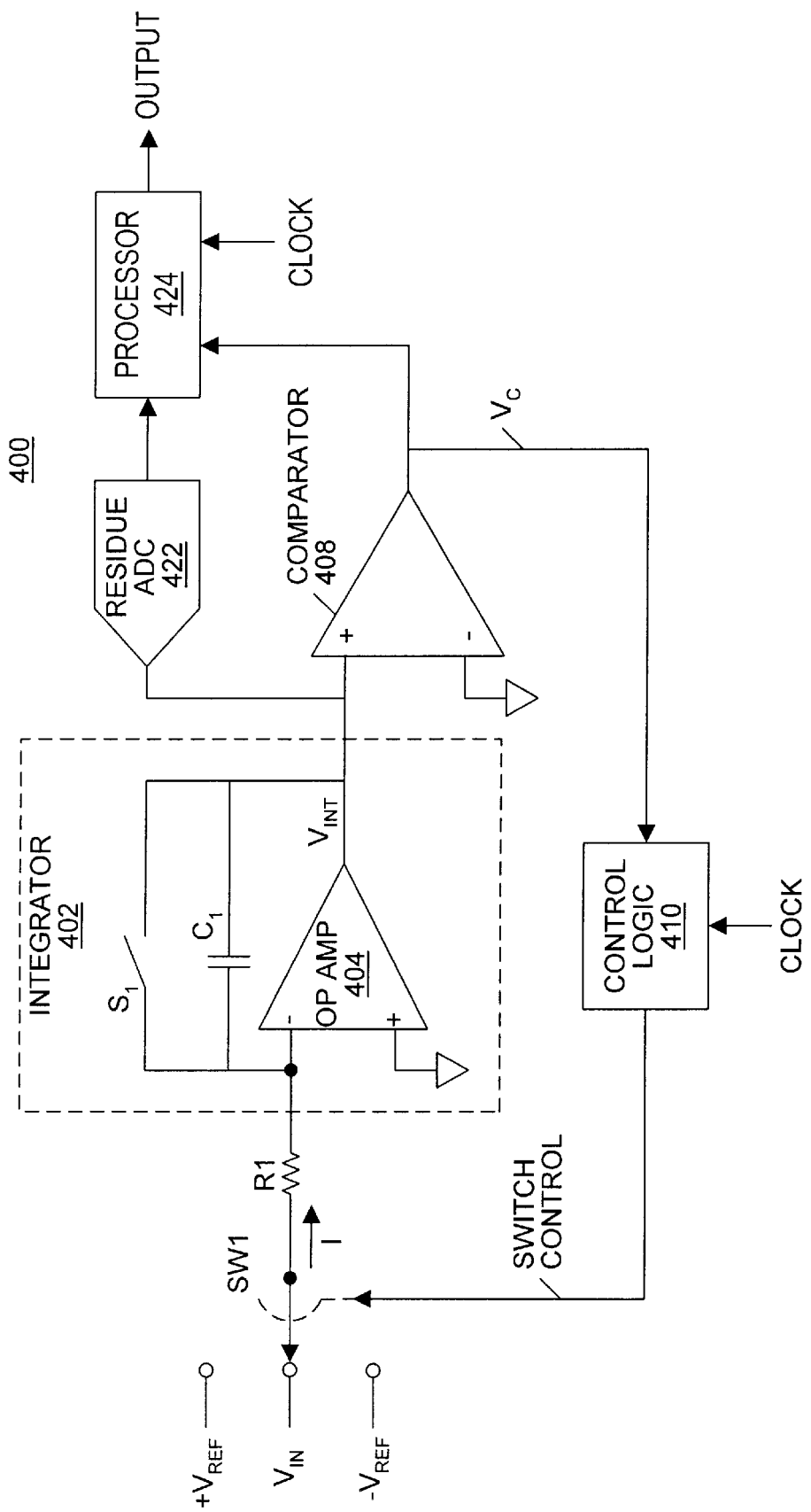
FIG. 11 illustrates a dual slope (or sigma delta type) A/D converter according to one embodiment of the present invention.

FIG. 11—Dual Slope (or Sigma Delta) Integrating A/D Converter

FIG. 11 is a block diagram illustrating a dual slope (or sigma delta type) A/D converter 400 according to the present invention. Elements in FIG. 11 which may be similar or identical to those in the prior art FIG. 1 have the same reference numerals for convenience.

As shown, the A/D converter 400 includes a switch SW1 which may receive three different inputs, these being a positive reference voltage +Vref, a negative reference voltage −Vref, and the analog input signal Vin. The output of the switch SW1 is provided through a resistor R1 to an input of an integrator 402.

As shown, the integrator 402 includes operational amplifier 404, capacitor C1 and switch S1. The capacitor C1 and switch S1 are connected in parallel with the op amp 404. The output of the switch SW1 is provided through a resistor R1 to an input of the op amp 404, with the other input of the op amp being connected to ground or a reference voltage. The output of the integrator 402 is an integrator voltage signal referred to as Vint.

The output Vint is provided to an input of a comparator 408. The other input of the comparator 408 is connected to ground or a reference voltage.

The output signal Vint is also provided as an input to a residue analog to digital converter (residue ADC) 422. The output of the residue ADC 422 is provided as an input to a processor 424. The output of the comparator 408, referred to as Vc, is also provided as an input to the processor 424. The processor 424 also receives a clock signal input. The processor 424 is operable to receive the digital output of the residue ADC 422 and calculate fractional slope count information according to the present invention.

The processor 424 may comprise a CPU, DSP, microcontroller, reconfigurable logic, e.g., an FPGA, discrete logic or other type of logic or programmable device comprised on the instrumentation device 104. Alternatively, the function of the processor 424 may be performed by the host CPU 160 comprised in the computer system in response to software execution. Thus, the processor 424 may be implemented in a number of different ways, either on the instrument card 104 or in logic separate from the instrument card 104. As used herein, the term "processor" is intended to include any of the above implementations, as well as others.

The comparator output signal V is provided as an input to control logic 410. The control logic 410 receives a clock signal as shown. The control logic 410 outputs a switch control signal which is provided to control the switch SW1 to select either the positive reference voltage, the negative reference voltage or the analog input signal Vin as input to the A/D converter 400. The control logic 410 also controls the switch S1. In one embodiment, the control logic 400 performs the function of the processor 424.

Figure 13:
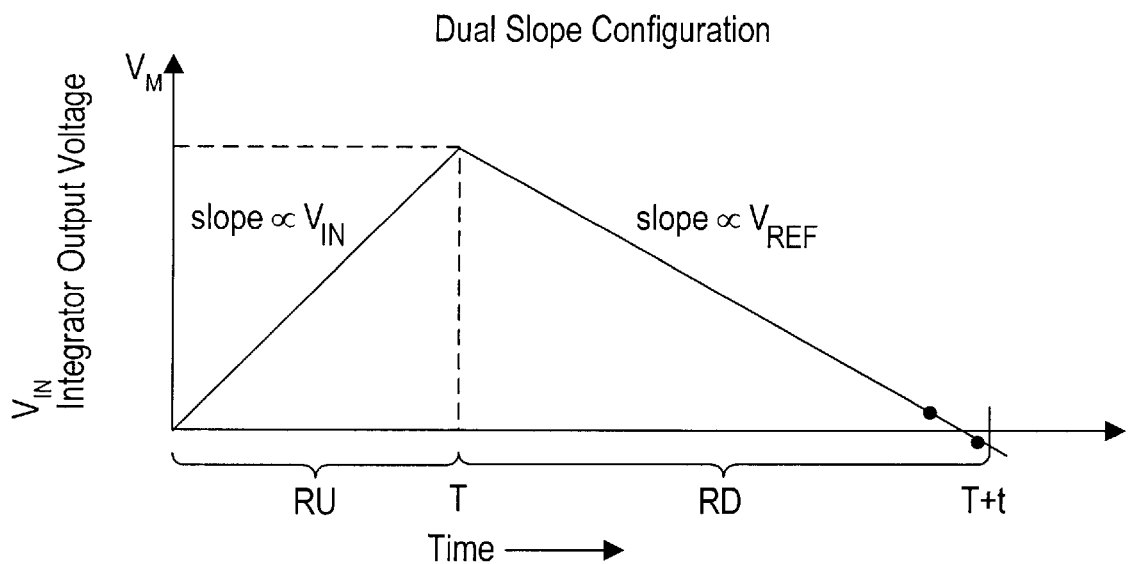
FIG. 13 shows a waveform illustrating operation of the dual slope A/D converter according to one embodiment of the present invention.

In a dual-slope configuration, the analog input signal Vin is first selected to be provided to the integrator 402 during the ramp-up period as shown in FIG. 13. After a predetermined length of time, either the positive reference voltage +Vref or negative reference voltage −Vref are provided during the ramp-down period to return the integrator 402 to its original value. The negative reference voltage −Vref is provided during the ramp-down period if Vin is a positive signal, and the positive reference voltage +Vref is provided if the analog input signal Vin is a negative signal.

According to the preferred embodiment of the invention, the residue ADC 422 operates to measure the integrator voltage Vint at a plurality of points during the ramp-down interval, preferably near the end of the ramp-down interval. These measurements are provided to the processor 424, which operates to extrapolate and/or interpolate the point in time where the integrator voltage returned to its original value, e.g., crossed zero. In a typical case, the original value of the integrator was zero, and thus the processor 424 uses the plurality of measurements to determine the zero crossing. The plurality of measurements may be all before or all after the integrator voltage Vint returned to its original value, in which case extrapolation is used to determine the original value crossing. Alternatively, one or more of the measurements may be before the integrator voltage Vint returned to its original value and one or more of the measurements may be after the integrator voltage Vint returned to its original value, in which case interpolation is preferably used.

In the preferred embodiment, the residue ADC 422 measures the integrator voltage Vint at the last two clock cycles of the ramp-down interval, which may be before and/or after the integrator voltage Vint crosses the original value, e.g., before and after the integrator voltage Vint crosses zero. The measurements preferably occur at the last two clock cycles of the ramp-down interval, wherein a first measured integrator voltage is before the original value and a second measured integrator voltage is after the original value. Interpolation is then used to determine the crossing point, e.g., the zero crossing where the original value is zero.

Figure 14:
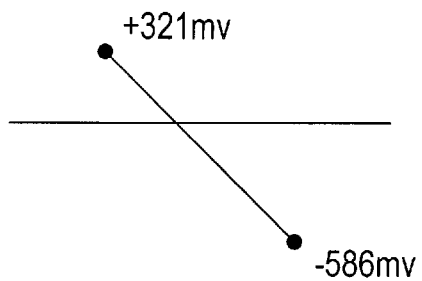
FIG. 14 illustrates calculation of the zero-crossing using residual voltages measured before and after the zero crossing.

FIGS. 13 and 14 illustrate integrator measurements that are made before and after, in this case above and below, the respective zero crossing where the integrator voltage returns to its original value, referred to as y0.

For example, where the first integrator voltage before the original value (referred to as y0) has value y1 and the second integrator voltage after the original value has value y2, the fractional slope count value is determined by computing:

(y1−y0)/(y1−y2). Where the original value y0 is 0, the equation reduces to: y1/(y1−y2). A larger number of measurements may be used, wherein a best-fit line extrapolation technique may be used to provide greater accuracy.

Figure 12:
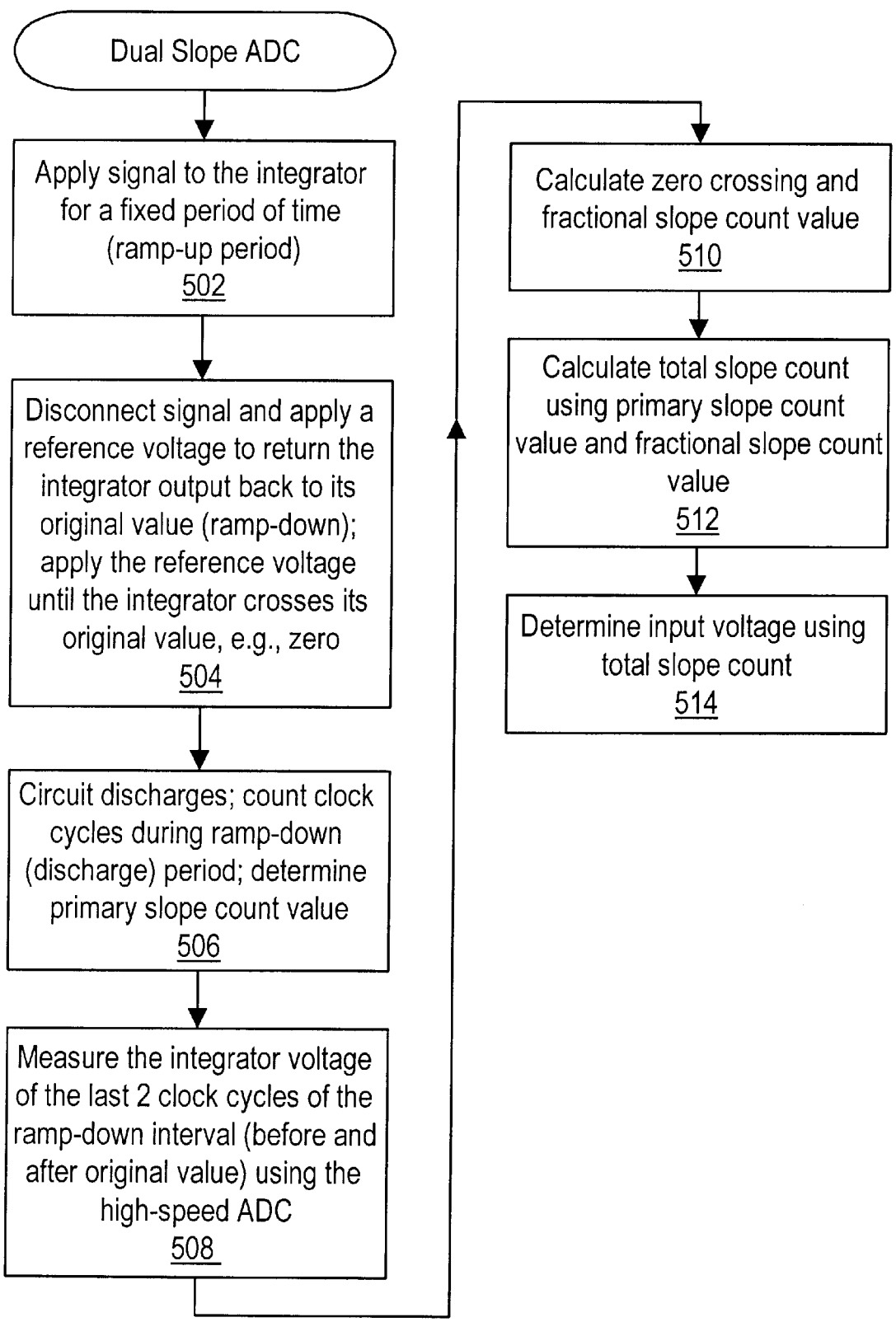
FIG. 12 is a flowchart diagram illustrating operation of the dual slope A/D converter of FIG. 11.

FIG. 12—Dual-Slope ADC Flowchart Diagram

FIG. 12 is a flowchart diagram illustrating operation of a dual-slope ADC, such as that shown in FIG. 11. Various of the steps in FIG. 11 may occur concurrently or in different orders than that shown.

As shown, in step 502 the analog input signal is applied to the integrator for a fixed period of time, i.e., during the ramp-up (RU) period. This corresponds to the ramp-up period shown in FIG. 13. Here it is presumed that the integrator begins from an original value or starting value, which generally or typically is zero. In the following description, the "original value" is referred to as zero for convenience. In one embodiment, a reset phase occurs prior to step 502, wherein switch S1 is closed.

In step 504 the analog input signal is disconnected, and a reference voltage is applied to return the integrator output back to its original value. This corresponds to the ramp-down period shown in FIG. 13. In the preferred embodiment, the reference voltage is applied to return the original output all the way back to its original value, i.e., until the integrator voltage crosses its original value, e.g., zero.

In one embodiment, the reference voltage is applied for a much shorter amount of time and does not necessarily return the integrator all the way back to its original value. Rather, the reference voltage may be applied for a sufficient amount of time for a plurality of integrator voltage measurements to be taken, whereby the time in which the integrator voltage would have returned to its original value can be extrapolated from these measurements, such as by using linear extrapolation or a best-fit line computation.

In step 506, while the circuit or integrator 402 is discharging in step 504, the processor 424 operates to count the clock cycles during the ramp-down or discharge period to determine a primary slope-count value. The primary slope-count value preferably comprises the number of complete or integer clock cycles during the ramp-down period. Observe that step 506 is performed substantially concurrently with step 504. In other words, as the reference voltage is applied to return the integrator 402 back to its original value in step 504, the processor 424 counts the number of clock cycles during this ramp-down period in step 506 to determine the primary slope-count value.

In an embodiment where the reference voltage is not applied to completely return the integrator output back to its original value, but rather is applied for a lesser period of time, then extrapolation is preferably used, such as a line fitting technique, possibly to determine the total (including fractional) number of clock cycles which would have occurred if the ramp-down period had been allowed to complete. This extrapolation would involve determining both the primary slope count and the fractional slope count that would remain after all of the integer number of slope counts had occurred, using similar extrapolation techniques.

In step 508 the integrator voltage is measured a plurality of times, using the residue ADC 422. In the preferred embodiment, the last two clock cycles of the ramp-down interval, which are preferably before and after the original value, e.g., before and after the zero crossing, are measured by the residue ADC. In another embodiment, a plurality of measurements may be made only before the integration voltage Vint returns to its original value and/or a plurality of measurements may be made only after the integration voltage Vint returns to its original value. In instances where the plurality of measurements are made only before or only after the zero crossing, then extrapolation is performed to determine the zero crossing. In instances where the plurality of measurements are made both before and after the zero crossing, then interpolation is preferably performed to determine the zero crossing.

It is primarily important in step 508 to perform a plurality of measurements of the integrator voltage to be able to interpolate or extrapolate a fractional slope count based on where the integrator voltage returned to or crossed its original value, or would have crossed its original value if allowed to do so.

In step 510 the processor 424 calculates the point in time where the integrator voltage crossed its original value (y0), e.g., the zero crossing, and uses this information to compute a fractional slope count value. As described above, where a first integrator voltage measurement before the original value crossing (y0 crossing) has value y1, and a second integrator voltage measurement after the y0 crossing has value y2, the fractional slope count value is computed as (y1−y0)/(y1−y2). More specifically, where the original value y0 is zero, i.e., where a first integrator voltage measurement before the zero crossing has value y1, and a second integrator voltage measurement after the zero crossing has value y2, the fractional slope count value is computed as y1/(y1−y2).

In step 512 the processor 424 calculates the total slope count using the primary slope count value and the fractional slope count value. The total slope count is calculated as the sum of the primary slope count value and the fractional slope count value.

In step 514 the processor 424 outputs the total slope count as the conversion result corresponding to the input voltage. In other words, the total slope count is the digital output from the ADC, which corresponds to the analog input signal.

Dual-Slope ADC Example The following is an example for a dual slope ADC using the present invention. For the following examples, a residue ADC with a range of ±1 volt and a resolution of 1 mV (2000 counts, about 11 bits) is assumed.

In a dual-slope ADC, the signal is applied to the integrator for a fixed period of time. Then the signal is disconnected and a reference voltage of polarity appropriate to bring the integrator output back to its original value is applied until the integrator output crosses its starting or original value. Counting clock cycles during the discharge, or ramp-down, interval, gives a measure of the average value of the input signal over the original charging, or ramp-up, interval. Suppose for a given conversion cycle, for which the integrator was initially reset to zero volts, that the converter counts 1345 clock cycles during the ramp-down interval. The invention can be applied to this converter by measuring the integrator voltage with the residue ADC at the last two clock cycles of the ramp-down interval. If the measured voltages are +321 mV and −586 mV respectively, as shown in FIG. 14, then the zero crossing can be assumed to have occurred 321/(321+586) of the way between the two measurements. Thus a more accurate computation of the ramp-down time should be 1344+(321/(321+586))=1344.354. Clearly resolution has been significantly improved without requiring any calibration of fast-ADC gain with respect to integrator gain, other than that required to ensure that both integrator voltages were within the range of the residue ADC.

In this situation, there may be further benefit, in terms of measurement repeatability, to using multiple ADC conversions to compute the zero crossing, rather than just two. For example, if the integrator output were sampled at the last 10 clocks of the ramp-down interval, a zero crossing could be computed from the best-fit line to reduce the effects of noise and quantization of the residue ADC. Thus both interpolation and extrapolation techniques may be used to determine the zero crossing and hence the fractional slope count.

Figure 15:
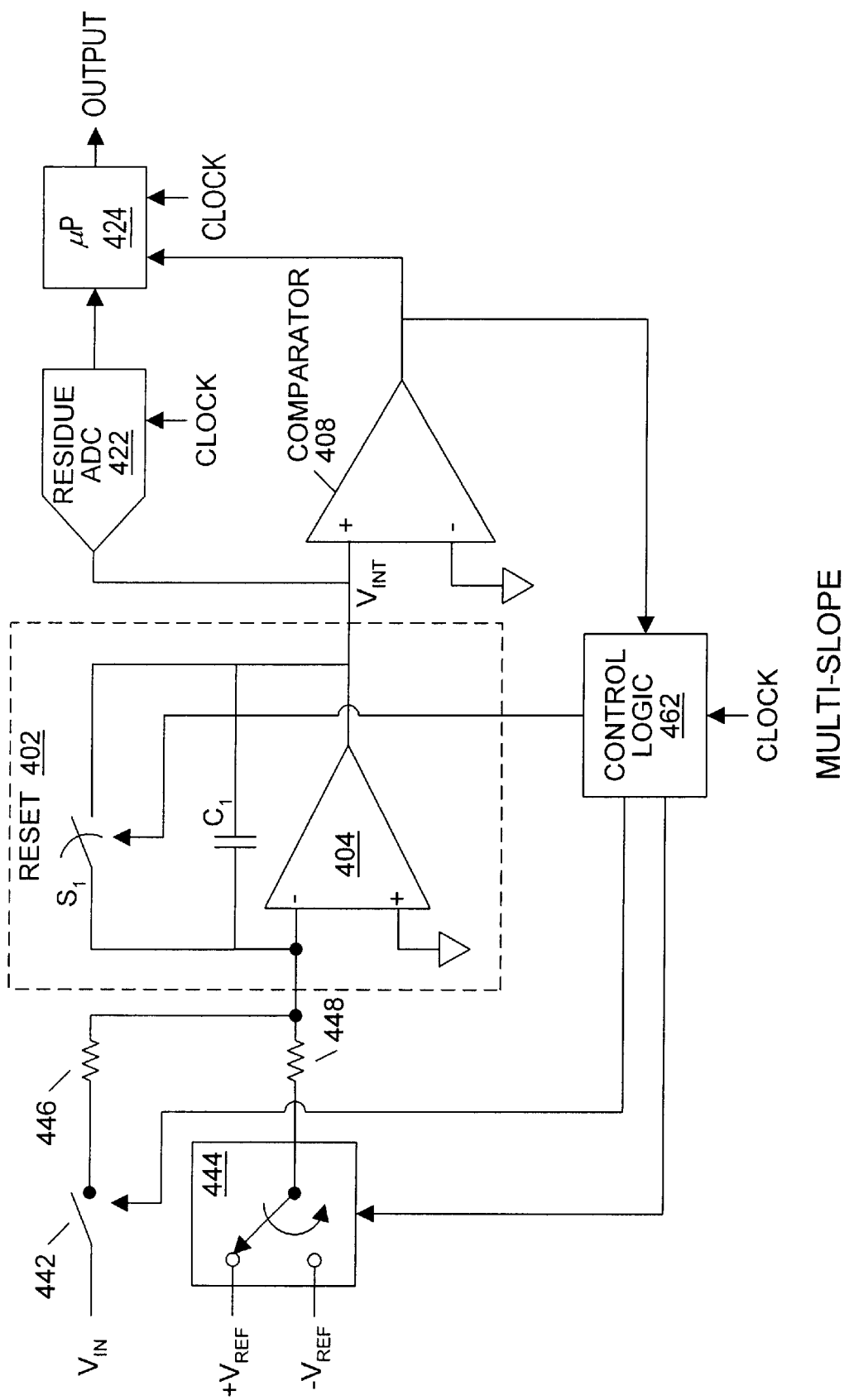
FIG. 15 illustrates a multi-slope A/D converter according to one embodiment of the present invention.

FIG. 15—Multi Slope Integrating A/D Converter

FIG. 15 is a block diagram illustrating one embodiment of a multi slope A/D converter according to the present invention. It is noted that various multi-slope architectures may be used with the present invention as desired, and FIG. 15 merely illustrates one example. Elements in FIG. 15 which may be similar or identical to those in FIG. 1 or FIG. 11 have the same reference numerals for convenience.

As shown, the multi-slope A/D converter in FIG. 15 includes an input for receiving the analog input signal Vin. Vin is provided through a switch 442 and resistor 446 to an input of integrator 402.

A positive reference voltage +Vref and a negative reference voltage −Vref are each connected to a respective switch 444, which provides the resulting signal through a resistor 448 to the input of the integrator 402.

As described above with respect to FIG. 11, integrator 402 comprises operational amplifier 404, capacitor C1 and optional reset switch S1. The capacitor C1 and switch S1 are connected in parallel with the operational amplifier 404. The analog input signal Vin is provided through switch 442 and resistor 446 to a first input of operational amplifier 404. The selected reference voltage, either +Vref or −Vref, is also provided through switch 444 and resistor 448 to the first input of operational amplifier 404. The other input of the operational amplifier 404 is connected to ground as shown.

The output of the integrator 402, referred to as Vint, is provided to an input of the comparator 408. The output of the integrator 402 is also provided to residue ADC 422 which in turn provides its output to processor 424. The comparator 408 also may provide an output to processor 424. The processor 424 also may receive a clock signal.

As discussed above, the residue ADC 422 operates to obtain a plurality of measurements during the ramp-down interval and these measurements are provided to the processor 424. In response, the processor 424 is operable to interpolate and/or extrapolate from these measurements the approximate or precise point in time where the integrator voltage returned to or crossed (or would have crossed) its original value, i.e., when the zero crossing occurred or would have occurred. This information is used by the processor 424 in determining a fractional slope count. The fractional slope count is used in combination with the primary slope count in computing the output of the A/D converter. In the multi slope type A/D converter, the primary slope count comprises the difference in positive and negative slope counts which occurred during the ramp-up and possibly ramp-down periods.

As noted above, the processor 424 may be any of various types, and may be comprised locally with the A/D converter, or the functions of the processor 424 may be performed by a separate CPU executing software, such as the CPU 160 comprised in the computer system in which the A/D converter is incorporated.

The comparator 408 also provides an output to control logic 462. The control logic 462 is operable to control the reset switch S1, as well as the switches 442 and 444 for selectively controlling whether the analog input signal Vin and/or either the positive or negative reference voltages +Vref or −Vref are provided to the input of the integrator 402.

Figure 16:
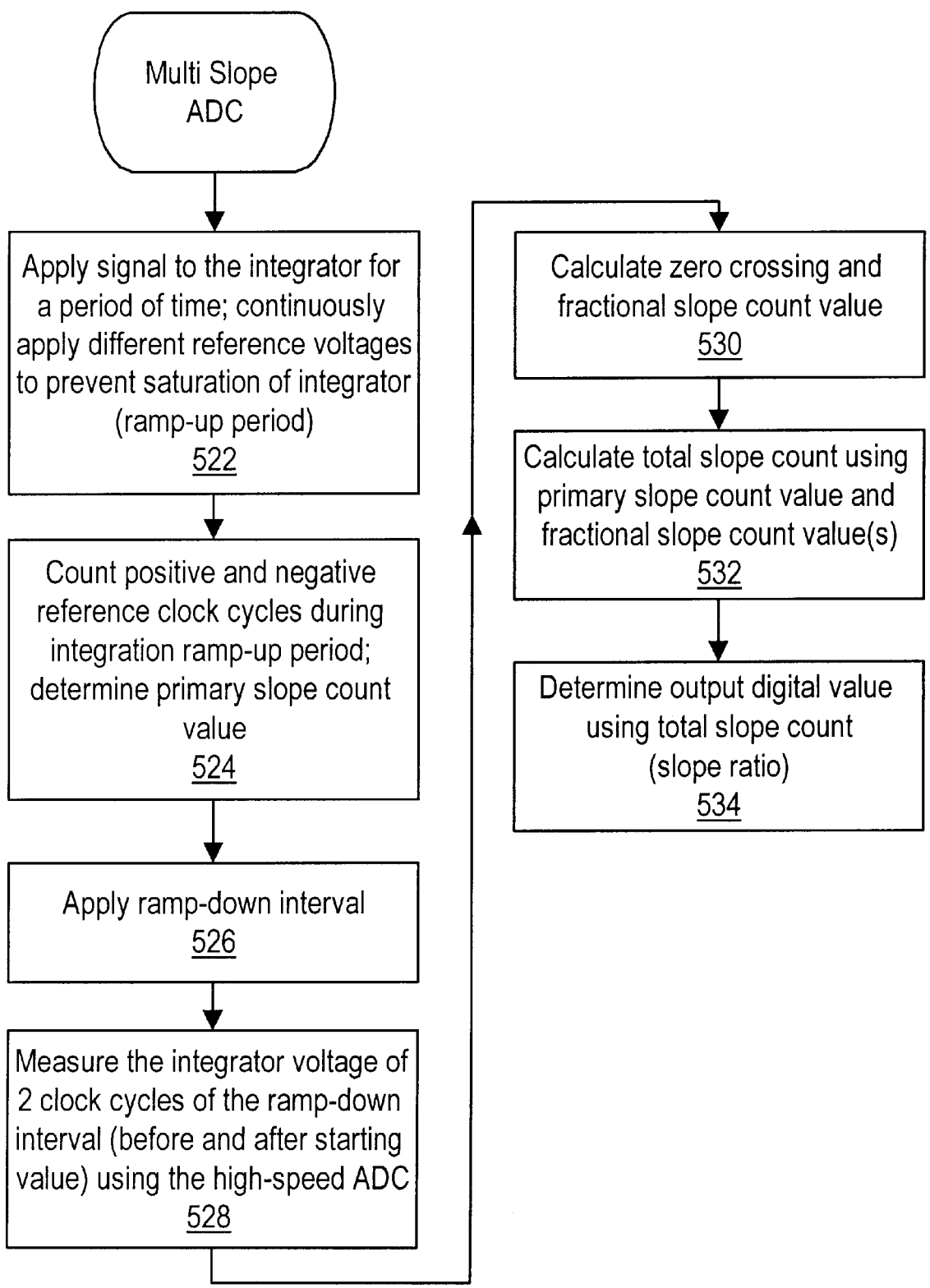
FIG. 16 is a flowchart diagram illustrating operation of the multi-slope A/D converter of FIG. 15.

FIG. 16 Multi-Slope ADC Flowchart Diagram

FIG. 16 is a flowchart diagram illustrating operation of the multi-slope ADC according to the present invention. Various of the steps in FIG. 16 may occur concurrently or in different orders than that shown.

Figure 17:
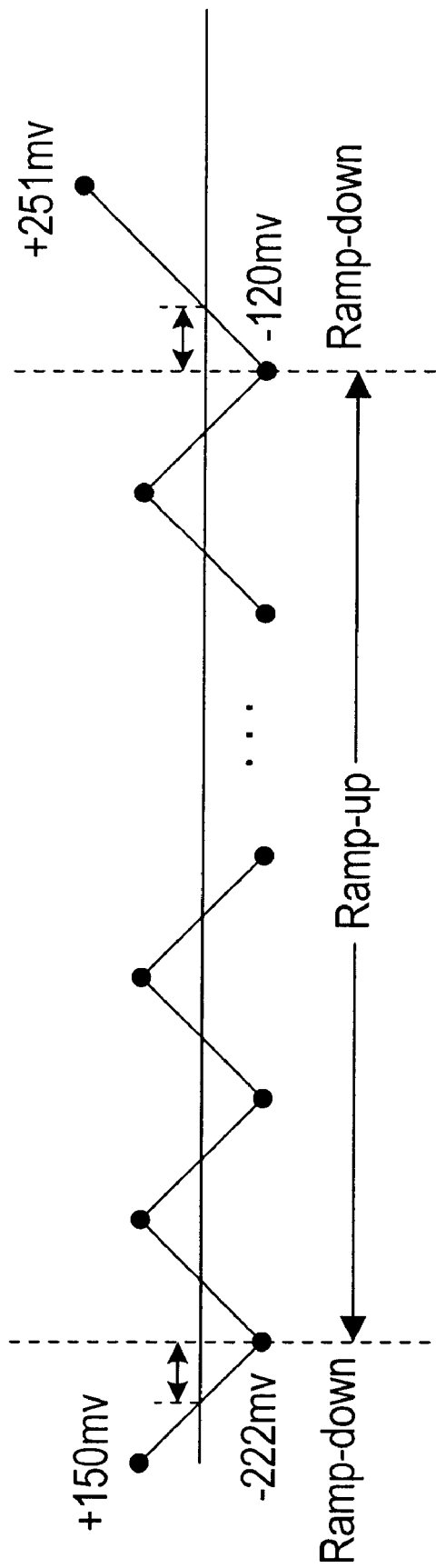
FIG. 17 shows a waveform illustrating operation of the multi-slope A/D converter according to the present invention, including measurement of the zero crossing.

As shown, in step 522 the analog input signal Vin is applied to the input of the integrator 402 for a period of time. As with conventional multi-slope operation, the reference voltages +Vref and −Vref are selectively continuously applied to the integrator 402 to prevent saturation of the integrator 402. Step 522 comprises the ramp-up period or run-up period as shown in FIG. 17.

In step 524 the processor 424 operates to count the positive and negative reference clock cycles during this integration ramp-up period to determine a primary slope count value. Thus step 524 is performed substantially concurrently with step 522.

At the end of the ramp-up period, in step 526 the ramp-down interval may be applied. In the ramp-down interval of step 526, the respective reference voltage is applied to return the integrator back to its original value. For example, if the original value of the integrator was zero, the appropriate reference voltage is applied to return the integrator output voltage to zero. It is noted that any complete positive or negative reference clock cycles occurring during the ramp-down interval in step 526 may also be counted in step 524.

In step 528 the residue ADC 422 operates to measure the integrator voltage Vint at a plurality of locations during the ramp-down interval. As discussed above, in the preferred embodiment the integrator voltage is measured at two clock cycles of the ramp-down interval which are before and after the original or starting value. In other embodiments, a plurality of measurements may be taken during the ramp-down interval only before the integrator voltage reaches its original value, i.e., before the zero crossing, and/or only after the integrator voltage reaches its original value, i.e., after the zero crossing. Also, a plurality of measurements may be taken both before and/or after the original value, i.e., both before and after the zero crossing.

In step 530 the processor 424 operates to calculate the time period or point in time where the original value (y0), e.g., the zero crossing, was reached (or would have been reached), and uses this information to compute a fractional slope count value. In response to this information, the processor 424 determines a fractional slope count value corresponding to the return of the integrator to its original value, i.e., occurring before the return of the integrator 402 to its original value. As described above, where a first integrator voltage measurement before the original value crossing (y0 crossing) has value y1, and a second integrator voltage measurement after the y0 crossing has value y2, the fractional slope count value is computed as $(y1-y0)/(y1-y2)$. More specifically, where the original value y0 is zero, i.e., where a first integrator voltage measurement before the zero crossing has value y1, and a second integrator voltage measurement after the zero crossing has value y2, the fractional slope count value is computed as $y1/(y1-y2)$.

In step 532 the processor 424 calculates the total slope count using the primary slope count value and the fractional slope count value. Specifically, assuming "A" positive slope counts and "B" negative slope counts during ramp-up, and assuming "a" positive (fractional) slope counts and "b" negative (fractional) slope counts during ramp-down, the result of the A/D conversion, called the "slope count" or "slope ratio," should be $((A+a)-(B+b))/((A+a)+(B+b))$. The positive fractional slope count "a" is the sum of the positive slope counts, if any, of the prior interval and/or the subsequent interval. In a similar manner, the negative fractional slope count "b" is the sum of the negative slope counts, if any, of the prior interval and/or the subsequent interval.

In step 534 the processor 424 outputs the slope ratio as the conversion result corresponding to the input voltage. In other words, the slope ratio is the digital output from the ADC. The slope ratio comprises a value between −1 and +1, with −1 corresponding to an analog input at minus the negative reference voltage and +1 corresponding to an analog input at minus the positive reference voltage.

FIG. 17 illustrates a waveform showing operation of the multi-slope ADC. As shown, the ramp-up interval may occur for a lengthy period of time wherein the reference voltages are selectively applied to prevent saturation of the integrator 402. During the ramp-down interval, as shown, two or more measurements may be taken to enable the zero crossing to be determined using interpolation and/or extrapolation techniques.

The method may also determine a fractional slope count occurring prior to the integration interval (prior to step 522), i.e., the fractional slope count occurring immediately prior to the ramp-up interval. This "prior interval" fractional slope count may also be based on two or more measured integrator voltages. The fractional slope count for the "prior interval" is determined in a similar manner as above. For example, where a first measured integrator voltage before the original value has value y1 and a second measured integrator voltage after the original value has value y2, the fractional slope count value for the "prior interval" is computed as (y2−y0)/(y2−y1); where y0 is the original value and is presumably zero. In this embodiment, in step 532 the processor 424 calculates the total slope count using the primary slope count as well as the fractional slope counts from both the "prior interval" before step 522 and the "subsequent interval" occurring during ramp-down in step 526 and calculated in step 530. The "prior interval" fractional slope count is shown on the left side of FIG. 17 and the "subsequent interval" fractional slope count is shown on the right side of FIG. 17.

Multi-Slope Integrating ADC Example

A multislope integrating ADC is similar to a dual-slope ADC except that the reference voltages are applied during a much longer ramp-up interval. Every clock cycle, typically, the output of the integrator is compared with zero (or some other voltage) to determine whether a positive or a negative reference should be applied during the next clock period. The output of the ADC is the total number of positive reference cycles minus the total number of negative reference cycles in a given integration interval, divided by the total number of clock cycles in the interval. The invention can provide increased resolution if a ramp-down interval is added to each measurement cycle. (Multislope ADCs sometimes include ramp-down intervals anyway.) A single-clock-cycle ramp-down interval may be sufficient. Integrator output measurements before and after the ramp-down give an indication of what fraction of a full positive or negative reference was necessary to reach zero volts.

In a continuously converting ADC, i.e., one without a reset phase, the measurements from one ramp-down can be used to provide information for the next conversion. For example, suppose the following sequence of events happens:
1. ramp-down for 1 clock cycle. positive reference applied. 1st ADC reading=+150 mV; 2nd ADC reading=−222 mV
2. ramp-up for 999 clock cycles. positive reference applied for 400 of those cycles.
3. ramp-down for 1 clock cycle. negative reference applied. 1st ADC reading=−120 mV; 2nd ADC reading=+251 mV The question is: what is the average value of the input signal during the ramp-up interval (line 2. above)? From line 1, 222/(222+150)=0.597 of a positive reference cycle was required for the integrator output to go from zero to where the ramp-up interval started. From line 2, 400 positive reference cycles and 599 negative reference cycles occurred from when the integrator output started the ramp-up interval to when it ended the ramp-up interval. From line 3, 120/(120+251)=0.323 of a negative reference cycle was required for the integrator output to go from where it ended the ramp-up interval back to zero. Thus, in this example there were 400.597 positive clock cycles and 599.323 negative clock cycles for a signal integration interval of 999 clock cycles, for an overall ADC output of (400.597−599.323)/(400.597+599.323)=−0.198742. Merely counting reference clock cycles would have yielded either −0.198 or −0.200. Again the technique has significantly improved resolution.

A modification of the above technique is to eliminate the ramp-down interval. In this case the interpolation provided by the residue ADC effectively varies the aperture of the overall ADC from sample to sample. The advantage of this technique is that it is never necessary to disconnect the input signal from the integrator. The disadvantages include variable aperture time and greater susceptibility to signal noise, which can corrupt the extrapolation of a zero crossing. The best way to avoid noise problems with this technique is to only use residue ADC samples on either side of a zero-crossing. Since there is no guarantee of a zero crossing every clock cycle, this further increases the variability of the ADC aperture time. Nevertheless, this could be a very useful technique for certain applications.

Figure 18:
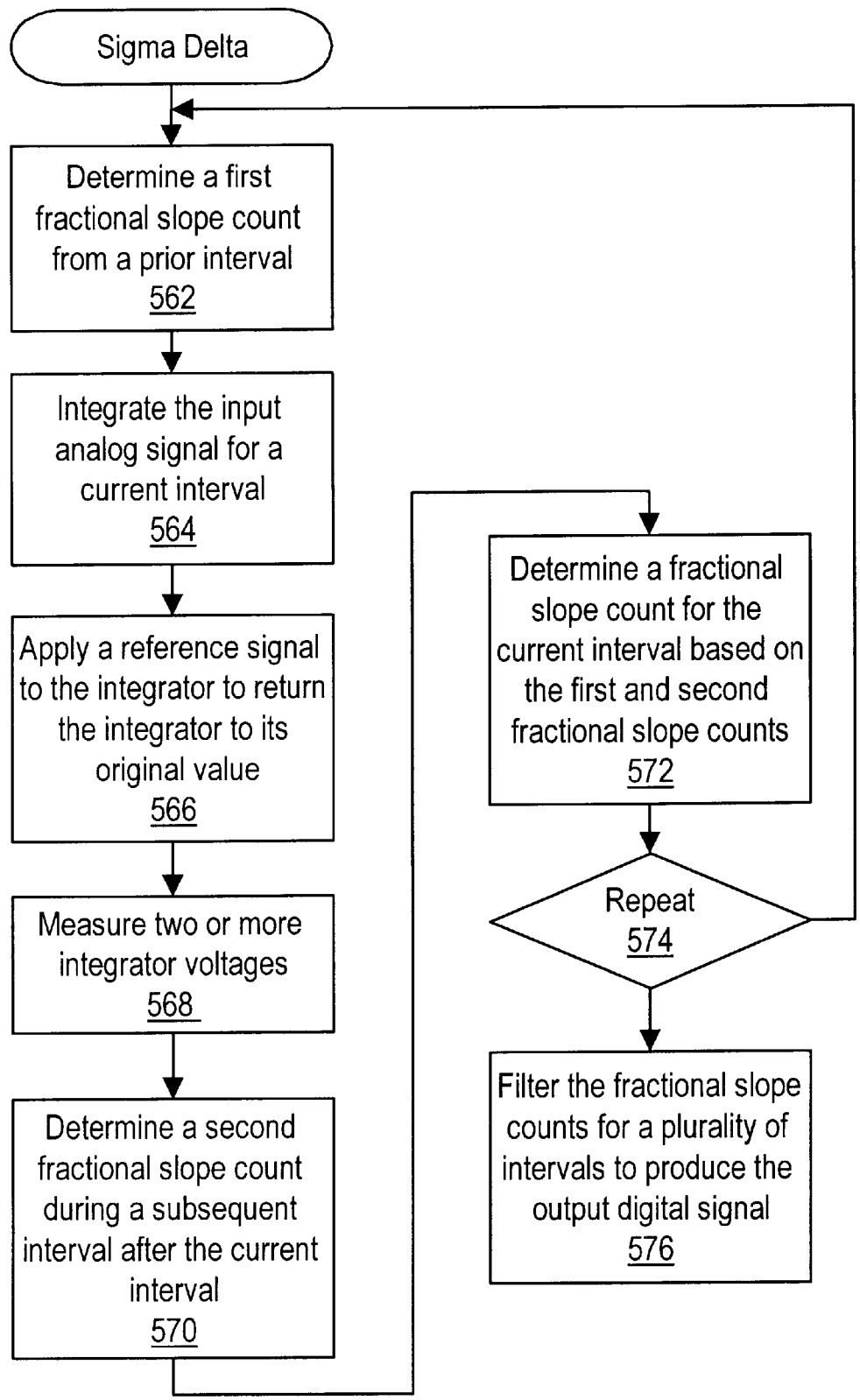
FIG. 18 is a flowchart diagram illustrating operation of a sigma delta A/D converter according to one embodiment of the present invention.

FIG. 18—Sigma Delta A/D Converter Flowchart Diagram

FIG. 18 is a flowchart diagram illustrating operation of the present invention used with a sigma delta (or delta sigma) A/D converter. The sigma delta A/D converter may be similar to that shown in FIG. 11.

In step 562 the method determines a first fractional slope count from a prior interval. Thus, here it is presumed that the sigma delta converter has been running for one or more cycles and that a first fractional slope count value was determined from a prior interval in the operation of the sigma delta converter. When the sigma delta converter is first turned on, there will be no prior interval, of course, and thus no first fractional slope count is determined (or needed) in this case, as the fractional slope count is zero.

In step 564 the input analog signal is integrated for a current interval. In a sigma delta type A/D converter, the current interval is typically one clock cycle.

In step 566 a reference signal is applied to the integrator to return the integrator to its original value. Step 566 occurs after the current interval in step 564.

In step 568 the residue A/D converter 422 is used to measure two or more integrator voltages during the ramp-down period of step 566 when the reference signal is being applied. In response to the two or more measured integrator voltages in step 568, in step 570 the processor determines a second fractional slope count during a subsequent interval which is after the current interval.

In step 572 a fractional slope count is determined for the current interval. This fractional slope count for the current interval is determined based on the first and second fractional slope counts determined in steps 562 and 570 respectively.

Steps 562–572 are repeated one or more times during operation of the delta sigma converter. After steps 562–572 have been repeated one or more times, in step 576 the fractional slope counts for the plurality of intervals are filtered to produce the output digital signal.

Sigma-Delta ADC Example

Single-bit sigma-delta ADCs have much in common with multislope integrating ADCs. As with multislope ADCs, every clock cycle the integrator output is compared with a fixed voltage (typically zero) to determine which polarity of reference to apply to the integrator during the next clock cycle. In a sigma delta ADC, however, the output data is derived from digitally filtering the bitstream resulting from the periodic comparisons of the integrator output to the fixed voltage. Since the counting in a multislope integrating ADC can be considered a simple form of digital filtering, multislope integrating ADCs can be considered to form a subset of sigma delta ADCs. To apply the invention to sigma delta ADCs, the signal may be applied every other clock cycle, with the feedback reference applied while the signal is not. This is equivalent to having alternating ramp-up and ramp-down intervals. To apply the invention, the integrator is measured on either side of a ramp-down interval as in the multislope ADC case and the weighting of the corresponding bit is modified accordingly. For example, suppose the following sequence of events happens:

1. ramp-down for 1 clock cycle. positive reference applied. 1st ADC reading=+150 mV; 2nd ADC reading=−222 mV
2. ramp-up for 1 clock cycle. (no reference applied during this time)
3. ramp-down for 1 clock cycle. negative reference applied. 1st ADC reading=−120 mV; 2nd ADC reading=+251 mV
4. ramp-up for 1 clock cycle.
5. ramp-down for 1 clock cycle. positive reference applied. 1st ADC reading=+422 mV; 2nd ADC reading=+19 mV The question this time is: what is the number stream (no longer merely a bit stream) to be applied to a following digital filter? As in the multislope integrating ADC example, from line 1 it took 222/(222+150)=0.597 of a positive reference cycle to get the integrator output from zero to where it started the ramp-up interval in line 2. From line 3, it took 120/(120+251)=0.323 of a negative reference cycle to get the integrator output from where it ended the ramp-up interval back to zero. Thus it took 0.597−0.323 =0.274 net reference cycles to cancel the 1-cycle ramp-up of line 2, so the first number in our output data stream is 0.274. Continuing on, in line 3 it took 251/(120+251)=0.677 of a negative reference cycle to get the integrator output from zero to where it started the ramp-up interval in line 4. From line 5, it took 422/(422−19)=1.047 of a positive reference cycle to get the integrator output from where it ended the ramp-up interval of line 4 back to zero. Thus it took 1.047−0.677=0.370 net reference cycles to cancel the 1-cycle ramp-up of line 4, so the second number in our output data stream is 0.370. So the invention has improved the resolution of the unfiltered data stream from [1,0] to [0.274, 0.370]. Notice that the feedback is still single-bit, so there is no requirement for a fast linear DAC, and the fast ADC non-linearity yields only high-frequency noise that will be digitally filtered away. The filtering also helps eliminate the small amount of noise that results from mismatch between the positive and negative references. To illustrate that low-frequency performance is insensitive to ADC errors, notice that the average value of our resulting 2 sample output data stream is completely independent of the readings taken in line 3. This is because if those voltages require more of the negative reference cycle to be applied to the first output datum, they by necessity require correspondingly less of the negative reference cycle to be applied to the second output datum, so the sum, and hence the mean, remains unchanged.

While the example has illustrated a first-order sigma-delta loop with single-bit feedback, the technique can be applied as well to higher-order loops and to multi-bit feedback converters.

The present invention thus comprises an A/D converter system and method for improving the resolution and lowering the noise of integrating-type ADCs, including sigma-delta type A/D converters.

The invention involves measuring integrator voltage in a manner which obviates any calibration between the integrator and the residue ADC. Because of this, much higher resolution fast ADCs can be used, for example 12 to 16 bits. This allows much better performance of the overall ADC. Furthermore, unlike multibit sigma delta converters, there is no requirement for low pipeline delay in the ADC, and the use of a single-bit feedback DAC guarantees excellent linearity.

The present invention may use the integrator voltage measurements to determine intervals over which the net integrator change is zero. This is preferably performed by using two successive integrator measurements to interpolate (or extrapolate, as the case may be) where the integrator voltage crossed (or would cross) zero. The signal and/or reference voltage applied to the integrator during the time between the two integrator measurements is assumed to be applied only during the fraction of the clock cycle necessary to reach the zero crossing. This produces a fractional count for that particular measurement. The fractional slope count is used in determining the total slope count, thereby improving the resolution, the degree of improvement being determined by the resolution of the residue ADC.

Numerous variations and modifications will become apparent to those skilled in the art once the above disclosure is fully appreciated. It is intended that the following claims be interpreted to embrace all such variations and modifications.

What is claimed is:

1. A method of converting an input analog signal into an output digital signal, the method comprising:

applying the input analog signal to an integrator for a period of time;

applying a reference signal to the integrator to return the voltage at the integrator output to an original value corresponding to a value prior to applying the input analog signal;

counting clock cycles during said applying the reference signal to determine a primary slope count value;

measuring the voltage at the integrator output two or more times during said applying the reference signal;

determining a fractional slope count using the measured two or more integrator output voltages to compute the fractional slope count occurring before the return of the voltage at the integrator output to the original value;

calculating a total slope count including the primary slope count value and the fractional slope count value; and determining the input analog signal using the total slope count value.

2. The method of claim 1, wherein said determining the fractional slope count comprises extrapolating the return of the voltage at the integrator output to the original value using the measured two or more integrator output voltages.

3. The method of claim 1, wherein said determining the fractional slope count comprises interpolating the return of the voltage at the integrator output to the original value using the measured two or more integrator output voltages.

4. The method of claim 1, wherein said measuring the voltage at the integrator output two or more times comprises measuring a first voltage at the integrator output before the original value and a second voltage at the integrator output after the original value;

wherein the original value has value y0, the first voltage at the integrator output before the original value has value y1 and the second voltage at the integrator output after the original value has value y2, wherein said determining the fractional slope count value comprises computing (y1−y0)/(y1−y2).

5. The method of claim 1, wherein the original value is zero, wherein said measuring the voltage at the integrator output two or more times comprises measuring a first integrator output voltage before a zero crossing and a second integrator output voltage after the zero crossing;

wherein the first integrator output voltage before the zero crossing has value y1 and the second integrator output voltage after the zero crossing has value y2, wherein said determining the fractional slope count value comprises computing y1/(y1−y2).

6. The method of claim 1, wherein the method implements dual slope integrating analog to digital conversion.

7. The method of claim 1, wherein the method implements multi slope integrating analog to digital conversion.

8. The method of claim 7, wherein said integrating produces an integrated output signal, a positive reference signal being applied to the integrator for a number of time intervals corresponding to a positive slope count and a negative reference signal being applied to the integrator for a remaining number of said time intervals corresponding to a negative slope count;

wherein the difference in positive and negative slope counts comprises the primary slope count value.

9. The method of claim 1, wherein said determining the fractional slope count determines a "subsequent interval" fractional slope count;

the method further comprising:

determining a "prior interval" fractional slope count prior to said integrating, wherein said determining the prior interval fractional slope count includes measuring the voltage at the integrator output two or more times prior to said integrating;

wherein said calculating the total slope count uses the primary slope count value, the "prior interval" fractional slope count value, and the "subsequent interval" fractional slope count value.

10. The method of claim 9, wherein said determining the "prior interval" fractional slope count includes measuring a first integrator output voltage having value y1 and a second integrator output voltage having value y2, wherein the original value is y0;

wherein said determining the "prior interval" fractional slope count value comprises computing (y2−y0)/(y2−y1).

11. A method of converting an input analog signal into an output digital signal, the method comprising:

applying the input analog signal to an integrator for a period of time;

applying a reference signal to the integrator to return the voltage at the integrator output to an original value, wherein the original value is zero;

counting clock cycles during said applying the reference signal to determine a primary slope count value;

measuring a first integrator output voltage before a zero crossing and a second integrator output voltage after the zero crossing;

determining a fractional slope count as a percentage of a clock cycle time period before the zero crossing;

calculating a total slope count, wherein the total slope count includes the primary slope count value and the fractional slope count value; and determining the input analog signal using the total slope count value.

12. The method of claim 11, wherein the first integrator output voltage before the zero crossing has value y1 and the second integrator output voltage after the zero crossing has value y2, wherein said determining the fractional slope count value comprises computing y1/(y1−y2).

13. The method of claim 11, wherein the method implements dual slope integrating analog to digital conversion.

14. The method of claim 11, wherein the method implements multi slope integrating analog to digital conversion.

15. The method of claim 14, wherein said integrating produces an integrated output signal, the integrated output signal being positive for a number of time intervals corresponding to a positive slope count and negative for a remaining number of said time intervals corresponding to a negative slope count;

wherein the difference in positive and negative slope counts comprises the primary slope count value.

16. An analog to digital converter for converting an input analog signal into an output digital signal, comprising:

an integrator operable to integrate the input analog signal for a first period of time, wherein the integrator is operable to receive a reference signal to return the integrator to an original value corresponding to a value prior to integrating the input analog signal;

a processor coupled to an output of the integrator for counting clock cycles while the reference voltage is applied to determine a primary slope count value;

a residue analog to digital converter coupled to the output of the integrator for measuring the voltage at the integrator output two or more times while the reference signal is applied;

wherein the processor is operable to determine a fractional slope count using the measured two or more integrator voltages to compute the fractional slope count occurring before the return of the voltage at the integrator output to the original value;

wherein the processor is further operable to calculate a total slope count including the primary slope count value and the fractional slope count value; and wherein the processor is further operable to determine the input analog signal using the total slope count value.

17. The analog to digital converter of claim 16, wherein, in determining the fractional slope count, the processor is operable to extrapolate the return of the integrator to the original value using the measured two or more integrator output voltages.

18. The analog to digital converter of claim 16, wherein, in determining the fractional slope count, the processor is operable to interpolate the return of the integrator to the original value using the measured two or more integrator output voltages.

19. The analog to digital converter of claim 16, wherein, in measuring the two or more integrator output voltages, the residue analog to digital converter is operable to measure a first integrator output voltage before the original value and a second integrator output voltage after the original value;

wherein the original value has value y0, the first integrator output voltage before the original value has value y1 and the second integrator output voltage after the original value has value y2, wherein the fractional slope count value is determined by computing (y1−y0)/(y1−y2).

20. The analog to digital converter of claim 16, wherein the original value (y0) is zero, wherein, in measuring the two or more integrator output voltages, the residue analog to digital converter is operable to measure a first integrator output voltage before a zero crossing and a second integrator output voltage after the zero crossing;

wherein the first integrator output voltage before the zero crossing has value y1 and the second integrator output voltage after the zero crossing has value y2, wherein the fractional slope count value is determined by computing y1/(y1−y2).

21. The analog to digital converter of claim 16, wherein the analog to digital converter is a dual slope integrating analog to digital converter.

22. The analog to digital converter of claim 16, wherein the analog to digital converter is a multi slope integrating analog to digital converter.

23. The analog to digital converter of claim 22, further comprising:

switch logic coupled to the input of the integrator for selectively providing the input analog signal, a positive reference signal, or a negative reference signal to the input of the integrator in a multi slope fashion;

wherein the integrator is operable to selectively receive one of the input analog signal, a positive reference signal, or a negative reference signal;

wherein the integrator produces an integrated output signal, the integrated output signal being positive for a number of time intervals corresponding to a positive slope count and negative for a remaining number of said time intervals corresponding to a negative slope count;

wherein the difference in positive and negative slope counts comprises the primary slope count value.

24. A method of converting an input analog signal into an output digital signal, the method comprising:

applying said input analog signal to an integrator over one or more time intervals to produce an integrated output signal, the integrated output signal being positive for a number of said time intervals corresponding to a positive slope count and negative for a remaining number of said time intervals corresponding to a negative slope count;

applying a reference signal to the integrator to return the integrator to an original value corresponding to a value prior to integrating the input analog signal;

measuring the integrator output voltage two or more times during said applying the reference signal;

determining a fractional slope count using the measured two or more integrator output voltages to compute the fractional slope count corresponding to the return of the integrator to the original value;

calculating a total slope count including the positive and negative slope count values and the fractional slope count value; and determining the input analog signal using the total slope count value.

25. The method of claim 24, further comprising:

counting clock cycles during said applying the reference voltage to determine a positive slope count value and a negative slope count value.

26. The method of claim 24, wherein said determining the fractional slope count comprises extrapolating the return of the integrator to the original value using the measured two or more integrator output voltages.

27. The method of claim 24, wherein said determining the fractional slope count comprises interpolating the return of the integrator to the original value using the measured two or more integrator output voltages.

28. The method of claim 24, wherein said measuring the integrator output voltage two or more times comprises measuring a first integrator output voltage before the original value and a second integrator output voltage after the original value;

wherein the original value has value y0, the first integrator output voltage before the original value has value y1 and the second integrator output voltage after the original value has value y2, wherein said determining the fractional slope count value comprises computing (y1−y0)/(y1−y2).

29. The method of claim 24, further comprising:

determining a fractional slope count prior to said integrating, wherein said determining a fractional slope count prior to said integrating comprises measuring a first and second integrator output voltage;

wherein the original value has value y0, the first integrator output voltage before the original value has value y1 and the second integrator output voltage after the original value has value y2, wherein said determining the fractional slope count value comprises computing (y1−y0)/(y1−y2).

30. The method of claim 24, wherein the original value (y0) is zero, wherein said measuring the integrator output voltage two or more times comprises measuring a first integrator output voltage before a zero crossing and a second integrator output voltage after the zero crossing;

wherein the first integrator output voltage before the zero crossing has value y1 and the second integrator output voltage after the zero crossing has value y2, wherein said determining the fractional slope count value comprises computing y1/(y1−y2).

31. A multi slope analog to digital converter for converting an input analog signal into an output digital signal, comprising:

an integrator operable to integrate the input analog signal for a first period of time, wherein the integrator includes an input which is operable to selectively receive one or more of the input analog signal, a positive reference signal, or a negative reference signal, wherein the integrator produces an integrated output signal, the positive reference signal being applied to the integrator for a number of time intervals corresponding to a positive slope count and the negative reference signal being applied to the integrator for a remaining number of said time intervals corresponding to a negative slope count;

a processor coupled to an output of the integrator for determining a positive slope count value and a negative slope count value;

a residue analog to digital converter coupled to an output of the integrator for measuring the integrator output voltage two or more times while the reference signal is applied;

wherein the processor is operable to determine a fractional slope count using the measured two or more integrator output voltages to compute the fractional slope count occurring before the return of the integrator to an original value corresponding to a value prior to integrating the input analog signal;

wherein the processor is further operable to calculate a total slope count including the positive and negative slope count values and the fractional slope count value; and wherein the processor is further operable to determine the input analog signal using the total slope count value.

32. The multi slope analog to digital converter of claim 31, wherein, in determining the fractional slope count, the processor is operable to extrapolate the return of the integrator to the original value using the measured two or more integrator output voltages.

33. The multi slope analog to digital converter of claim 31, wherein, in determining the fractional slope count, the processor is operable to interpolate the return of the integrator to the original value using the measured two or more integrator output voltages.

34. A method of converting an input analog signal into an output digital signal, the method comprising:

a) applying the input analog signal to an integrator for a current interval;

b) applying a reference signal to the integrator to return the integrator to an original value corresponding to a value prior to integrating the input analog signal;

c) measuring the integrator output voltage two or more times during said applying the reference signal;

wherein a first fractional slope count was determined in a prior interval immediately before the current interval, wherein the first fractional slope count indicates a deviation of the integrator from a reference value at the beginning of the current interval;

d) determining a second fractional slope count during a subsequent interval immediately after the current interval, wherein the second fractional slope count indicates a deviation of the integrator from a reference value at the end of the current interval;

e) determining a fractional slope count for the current interval based on the first and second fractional slope counts;

f) repeating said steps a)–e) one or more times; and g) filtering the fractional slope counts for a plurality of intervals to produce the output digital signal.

35. The method of claim 34, where the reference voltage and the input signal are time multiplexed.

36. The method of claim 34, wherein the method implements sigma delta analog to digital conversion.

37. A method of converting an input analog signal into an output digital signal in a sigma delta converter, wherein the sigma delta converter receives a reference voltage and the input analog signal in a time multiplexed fashion, the method comprising:

a) applying the input signal to an integrator to integrate the input analog signal for a current interval;

b) applying a reference signal to the integrator to return the integrator to an original value corresponding to a value prior to integrating the input analog signal during a ramp-down interval after the current interval, wherein the input signal is not applied to the integrator during the ramp-down interval;

c) measuring the integrator output voltage two or more times during said applying the reference signal;

wherein a first fractional slope count was determined in a prior interval immediately before the current interval, wherein the first fractional slope count indicates a deviation of the integrator from a reference value at the beginning of the current interval;

d) determining a second fractional slope count during a subsequent interval immediately after the current interval, wherein the second fractional slope count indicates a deviation of the integrator from a reference value at the end of the current interval;

e) determining a fractional slope count for the current interval based on the first and second fractional slope counts;

f) repeating said steps a)–e) one or more times; and g) filtering the fractional slope counts for a plurality of intervals to produce the output digital signal.

38. A method of converting an input analog signal into an output digital signal in a sigma delta converter, wherein the sigma delta converter receives a reference voltage and the input analog signal in a time multiplexed fashion, the method comprising:

a) applying the input signal to an integrator to integrate the input analog signal for a current interval;

b) applying a reference signal to the integrator to return the integrator to an original value corresponding to a value prior to integrating the input analog signal during a ramp-down interval after the current interval, wherein the input signal is not applied to the integrator during the ramp-down interval;

c) determining a slope count during said applying the reference signal, wherein the slope count indicates whether a positive or negative reference was applied during the interval;

d) repeating said steps a)–c) one or more times; and e) filtering the slope counts for a plurality of intervals to produce the output digital signal.

* * * * *